United States Patent
Supper

(10) Patent No.: US 7,033,853 B2
(45) Date of Patent: Apr. 25, 2006

(54) METHOD FOR PRODUCING A VERTICALLY EMITTING LASER

(75) Inventor: Dipl.-Ing. Daniel Supper, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 60 days.

(21) Appl. No.: 10/811,112

(22) Filed: Mar. 26, 2004

(65) Prior Publication Data

US 2005/0214961 A1    Sep. 29, 2005

(51) Int. Cl.
*H01L 21/00* (2006.01)
(52) U.S. Cl. .......................................... 438/39; 372/46
(58) Field of Classification Search ........... 372/46.013; 438/39
See application file for complete search history.

(56) References Cited

U.S. PATENT DOCUMENTS

2003/0235226 A1* 12/2003 Ueki ........................ 372/46

OTHER PUBLICATIONS

"Transverse Mode Selection in Large-Area Oxide-Confined Vertical-Cavity Surface-Emitting Lasers Using a Shallow Surface Relief", H. Martinsson, J.A. Vukusic, M. Grabherr, M. Michalzik, R. Jäger, K.J. Ebeling, and A. Larsson, IEEE Photonics Technology Letter, vol. 11, No. 12, Dec. 1999, pp. 1536-1538.

"Increased-area oxidized single-fundamental mode VCSEL with self-aligned shallow etched surface relief", H.J. Unold, M. Grabherr, F. Eberhard, F. Mederer, R. Jäger, M. Riedl, and K.J. Ebeling, Electronics Letters, Aug. 5th 1999, vol. 35, No. 16, pp. 1340-1341.

* cited by examiner

*Primary Examiner*—Asok Kumar Sarkar
(74) *Attorney, Agent, or Firm*—Eschweiler & Associates, LLC

(57) ABSTRACT

The invention is directed to a vertically emitting laser and a method of manufacturing such a laser having a current aperture and a semiconductor relief. The semiconductor relief and the current aperture are defined in the same processing operation, thereby causing the semiconductor relief and the current aperture to be substantially self-aligned with respect to one another. In addition, such processing results in an area ratio of the semiconductor relief and the current aperture to be substantially self-scaling with respect to processing variations.

17 Claims, 23 Drawing Sheets

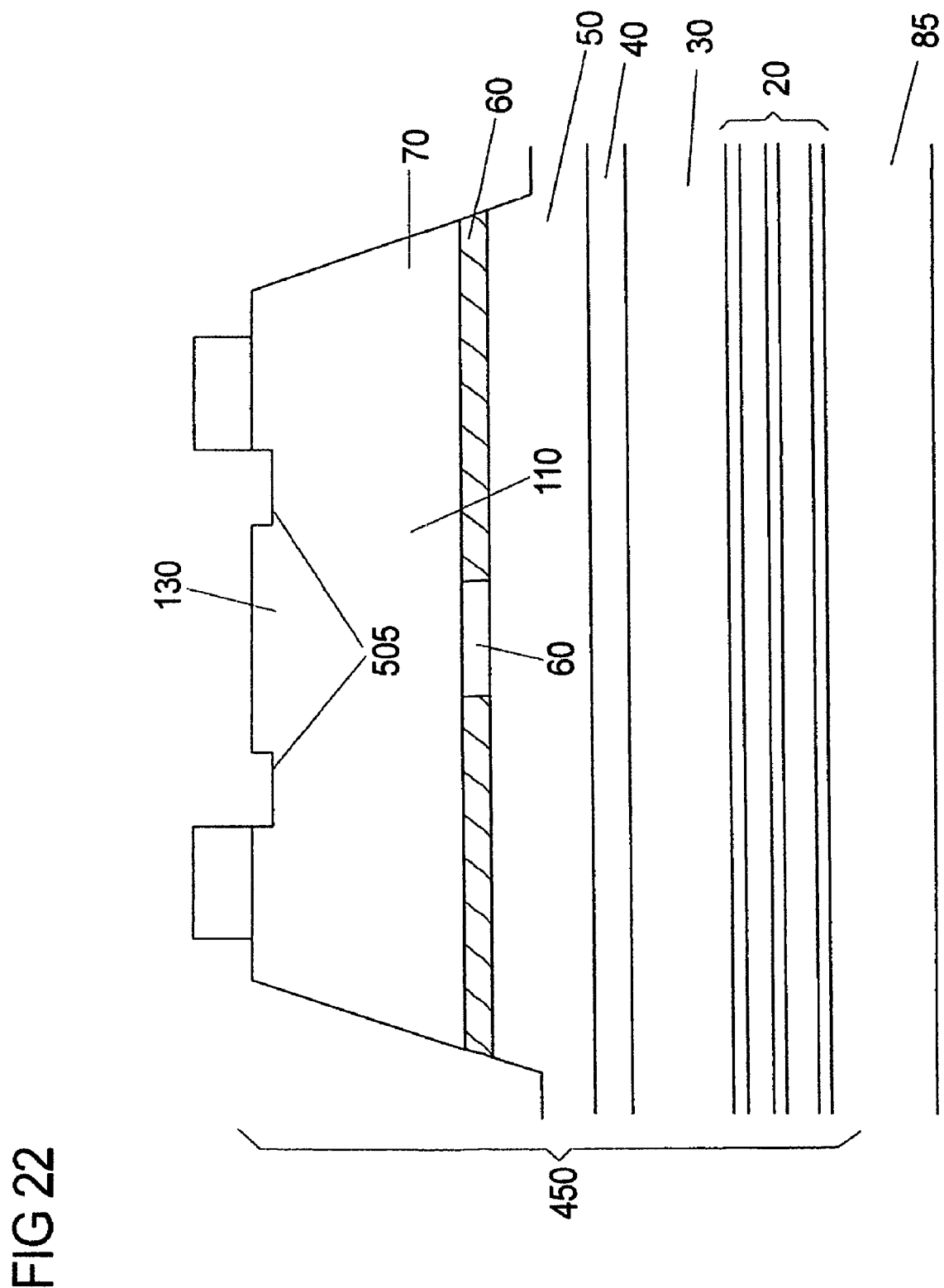

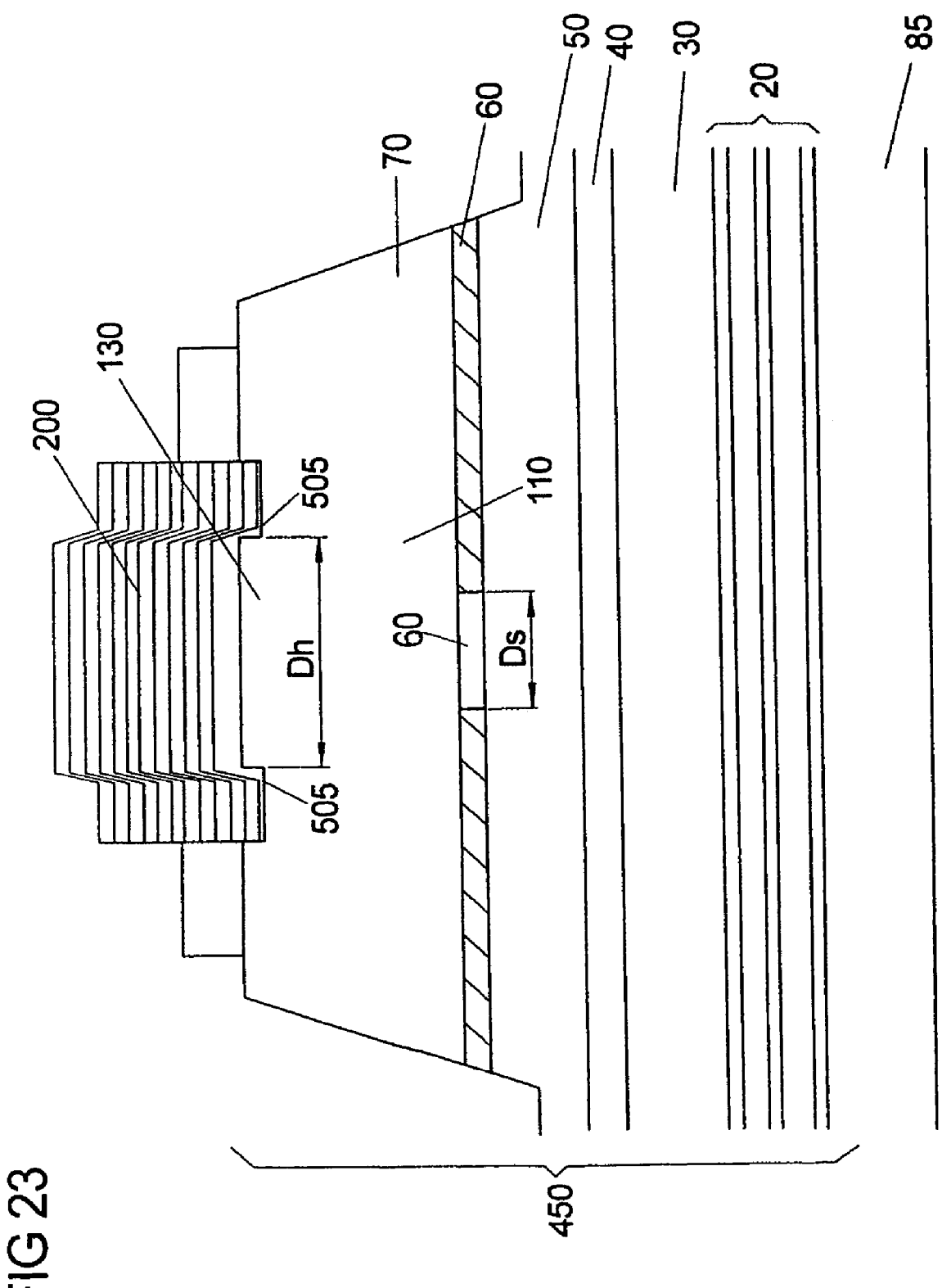

METHOD FOR PRODUCING A VERTICALLY EMITTING LASER

FIELD OF THE INVENTION

The invention relates to a method for producing a vertically emitting laser, in particular a VCSEL laser (VCSEL: Vertical Cavity Surface Emitting Laser).

BACKGROUND OF THE INVENTION

The document "Transverse Mode Selection in Large-Area Oxide-Confined Vertical-Cavity Surface-Emitting Lasers Using a Shallow Surface Relief" (H. Martinsson, J. A. Vukusic, M. Grabherr, M. Michalzik, R. Jäger, K. J. Ebeling, A. Larsson; IEEE Photonics Technology Letters, Vol. 11, No. 12, December 1999, pages 1536–1538) describes a method for producing a VCSEL laser, in which a so-called "semiconductor relief" is produced on the surface of the VCSEL laser. The function of the semiconductor relief is to suppress higher modes of the light generated in the active zone of the laser and to leave only the fundamental mode of the light as far as possible uninfluenced. In essence, the functioning of the semiconductor relief is based on the fact that higher modes have a field distribution in the case of which the light is guided principally at the edge of the radiation lobe of the light. In contrast thereto, the fundamental mode has a radiation behavior in the case of which the light is situated principally in the inner region of the radiation lobe of the light. The semiconductor relief thus preferably suppresses higher modes, so that principally or exclusively the fundamental mode of the VCSEL laser is coupled into optical components arranged downstream of the VCSEL laser.

In the case of the VCSEL laser in accordance with the already cited document "Transverse Mode Selection in Large-Area Oxide-Confined Vertical-Cavity Surface-Emitting Lasers Using a Shallow Surface Relief", the semiconductor relief is arranged on the top side of the VCSEL laser, that is to say above the upper mirror or mirror stack of the VCSEL laser. The semiconductor relief is thus separated from a current aperture of the VCSEL laser by the upper mirror layer of the laser. In the case of the VCSEL laser shown in the document, the current aperture has an area size with a diameter of 15.5 µm. In this case, the area size of the semiconductor relief is understood to be the area size of the inner raised region of the semiconductor relief. The current aperture arranged below the upper mirror layer of the VCSEL laser has an area size (or a diameter) which is larger than the area size (or the diameter) of the semiconductor relief. In concrete terms, the diameter of the current aperture is 20 µm.

The document "Increased-area oxidized single-fundamental mode VCSEL with self-aligned shallow etched surface relief" (H. J. Unold, M. Grabherr, F. Eberhard, F. Mederer, R. Jäger, M. Riedl, K. J. Ebeling; Electronics Letters, 5th Aug. 1999, Vol. 35, No. 16) furthermore discloses a method for producing a laser, in which the semiconductor relief and the current aperture are produced in a self-aligning manner. This means that the current aperture is arranged in a concentrically aligned manner relative to the semiconductor relief. The self-alignment is achieved by virtue of the fact that both the position of the semiconductor relief and the position of a mesa structure of the VCSEL laser are defined in the same mask step. The mesa structure is produced in subsequent etching steps, the semiconductor relief inevitably remaining arranged centrally in the mesa structure. The area size of the current aperture is defined in the context of an oxidation step during which the sidewalls of the etched mesa structure are oxidized. This oxidation step effects lateral "oxidation into" the current aperture layer contained in the mesa structure. The semiconductor relief is separated from the current aperture by an upper mirror layer.

Accordingly, the invention provides a laser production method in which a current aperture and a semiconductor relief are produced; the area size of the semiconductor relief and the area size of the current aperture are defined in the same production step.

An essential advantage of the method according to the invention is that it is always ensured that the area size of the semiconductor relief and the area size of the current aperture are in a fixed relationship with respect to one another, since both the semiconductor relief and the current aperture are defined in the same production step. By way of example, if production tolerances occur on account of fluctuations in the production conditions (e.g. production temperature, moisture fluctuations), then the area size of the semiconductor relief will change under certain circumstances; however, since the semiconductor relief and the current aperture are defined in the same production step, the area size of the current aperture will also simultaneously be affected by the fluctuations in the production conditions, so that its size changes as well. As a result, the area size of the semiconductor relief and the area size of the current aperture will consequently change relatively "similarly", so that they will nevertheless have a size ratio with respect to one another that corresponds to the actually desired size ratio without production tolerances. The area size of the semiconductor relief and the area size of the current aperture thus comply with a predetermined size ratio "in a self-scaling manner"; a "self-scaling" does not occur in the case of the previously known method described in the introduction, because the definition of the semiconductor relief and the definition of the current aperture are effected in separate production steps.

A further essential advantage of the common production process for the semiconductor relief and the current aperture is that the yield in the production of the lasers is increased: it is because generally each current aperture diameter is matched only by a specific semiconductor relief diameter in order to obtain a single-mode radiation with a maximum optical output power at the output of the laser. The fixed scaling of the semiconductor relief and of the current aperture considerably increases the production yield and the process stability.

The area size of the semiconductor relief and the area size of the current aperture may be defined for example in an oxidation step; this procedure is advantageous in particular because current apertures are usually produced in an oxidation step. Consequently, in this refinement of the method, the size of the semiconductor relief is defined during the oxidation of the current aperture.

During the production of the VCSEL laser, an oxidizable auxiliary layer for the definition of the area size of the semiconductor relief and an oxidizable current aperture layer for the definition of the current aperture are preferably subjected to the common oxidation step. In this case, the ratio between the oxidation rate of the oxidizable auxiliary layer and the oxidation rate of the current aperture layer defines the size ratio between the area size of the resulting semiconductor relief and the area size of the resulting current aperture. The oxidizable auxiliary layer and the current aperture layer may be for example layers made of AlGaAs material, the proportion of aluminum determining the oxidation rate: the higher the proportion of aluminum, the greater the oxidation rate.

During the production of the VCSEL laser, a mesa structure is preferably produced, which mesa structure encompasses or includes the oxidizable auxiliary layer and also the current aperture layer. The sidewalls of the mesa structure are subsequently oxidized, thereby also effecting oxidation "into" the oxidizable auxiliary layer and the current aperture layer within the mesa structure. The size ratio between the area size of the semiconductor relief and the area size of the current aperture is defined in this case.

In order to produce the VCSEL laser, it is possible, by way of example, firstly to arrange at least one semiconductor intermediate layer on the oxidizable current aperture layer of the VCSEL laser. The oxidizable auxiliary layer is subsequently arranged on the semiconductor intermediate layer. A covering layer is applied to the oxidizable auxiliary layer, for example by being grown epitaxially. The mesa structure is subsequently etched into the resulting layer stack, and the sidewalls of the mesa structure are subjected to the oxidation step. The oxidizable current aperture layer and the oxidizable auxiliary layer are laterally oxidized simultaneously during this oxidation step.

The VCSEL laser is completed particularly simply and thus advantageously by subsequently removing the oxidizable auxiliary layer in its oxidized regions, a region of the semiconductor intermediate layer being uncovered. The semiconductor intermediate layer is subsequently etched in the uncovered region down to a depth corresponding to the depth of the semiconductor relief to be produced. In addition, the covering layer and the non-oxidized regions of the oxidizable auxiliary layer are completely removed, thereby uncovering the semiconductor relief in the semiconductor intermediate layer. This then concludes the formation of the semiconductor relief.

Afterward, a mirror layer or a mirror layer stack comprising a plurality of mirror layers, which forms the upper mirror layer of the laser, is preferably deposited on the semiconductor relief. The semiconductor relief is thus arranged between the mirror layer of the VCSEL laser and the current aperture of the VCSEL laser.

In contrast to the previously known methods mentioned in the introduction, the area size of the semiconductor relief is preferably made to be larger than the area size of the current aperture in order to achieve an optimum radiation behavior.

The upper mirror layer (or the upper mirror layers) deposited on the semiconductor relief may be for example layer stacks or layer pairs made of dielectric materials, preferably made of aluminum oxide and titanium oxide.

Furthermore, it is regarded as advantageous if an upper electrical contact of the VCSEL laser is arranged in a self-aligned manner relative to the current aperture and relative to the semiconductor relief, as a result of which a homogeneous current injection is achieved.

The upper electrical contact is preferably an intra-cavity contact, that is to say a contact which makes contact with a semiconductor layer of the VCSEL laser that is arranged below the upper mirror layer of the VCSEL laser.

The intra-cavity contact may be formed for example on the semiconductor intermediate layer already mentioned above.

The invention furthermore relates to a vertically emitting laser, in particular a VCSEL laser, with an as far as possible optimum radiation behavior.

The invention provides a laser, in particular a VCSEL laser, with a semiconductor relief for radiating undesirable modes, in which the semiconductor relief is arranged between an upper mirror layer of the laser and a current aperture of the laser.

Disturbing higher modes of the laser can be suppressed particularly simply and thus advantageously if the area size of the semiconductor relief is chosen to be larger than the area size of the current aperture. One advantage of the area ratio chosen in this way between the semiconductor relief and the current aperture consists in avoiding incomplete depletion of charge carriers below the semiconductor relief and—caused by a slow diffusion process—impairment of the modulation behavior of the laser.

The mirror layer of the VCSEL laser preferably comprises layer stacks or layer pairs made of dielectric materials, preferably made of aluminum oxide and titanium oxide.

As already mentioned in the introduction the VCSEL laser may have an intra-cavity contact as the upper electrical contact; as an alternative or in addition, the second or "lower" electrical contact of the laser may also be an intra-cavity contact.

BRIEF DESCRIPTION OF THE DRAWINGS

For elucidating the invention,

FIGS. 17–23 show a third exemplary embodiment of the method according to the invention and a laser according to the invention.

DETAILED DESCRIPTION OF THE INVENTION

In FIGS. 1 to 23, the same reference symbols are used for identical or comparable components.

Figure 1:
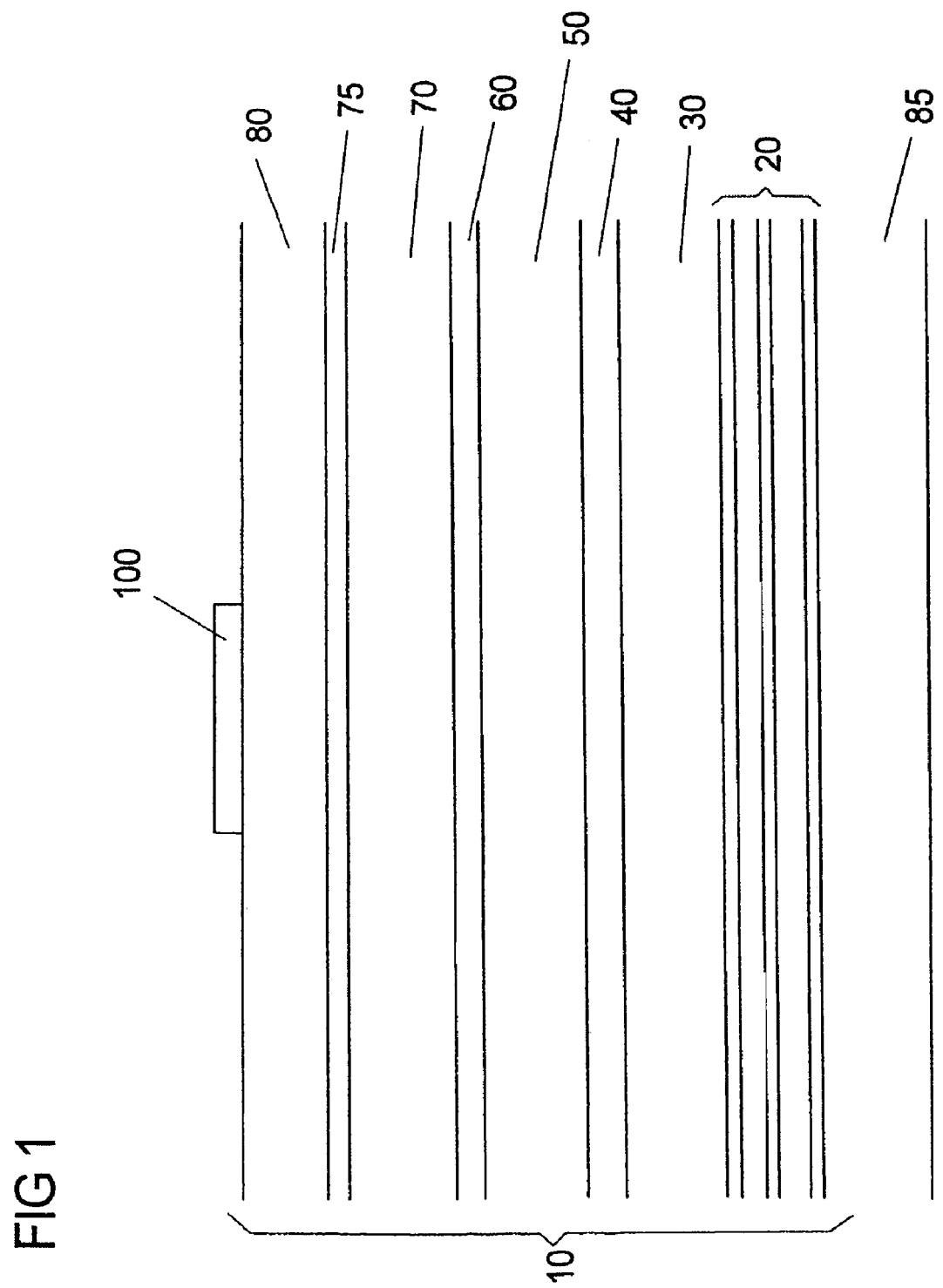
FIGS. 1–8 show a first exemplary embodiment of the method according to the invention and a laser according to the invention on the basis of diagrammatic illustrations.

Firstly, a first exemplary embodiment of the invention is explained in connection with FIGS. 1 to 8. FIG. 1 shows a semiconductor layer stack 10 comprising a lower mirror layer stack 20 having a plurality of lower mirror layers, a lower weakly doped laser layer 30, an active (photon-generating) laser layer (laser zone) 40, a weakly doped upper laser layer 50, a current aperture layer 60, a semiconductor intermediate layer 70, an oxidizable auxiliary layer 75 and a covering layer 80.

The semiconductor layer stack 10 is arranged on a substrate 85.

A mask layer 100 is applied on the covering layer 80 of the semiconductor layer stack 10, which mask layer is patterned and will subsequently define a mesa structure. The mask layer 100 may be formed by a hard mask or a photoresist mask; a hard mask made of an oxide or made of a nitride, for example, is preferably involved.

Figure 2:
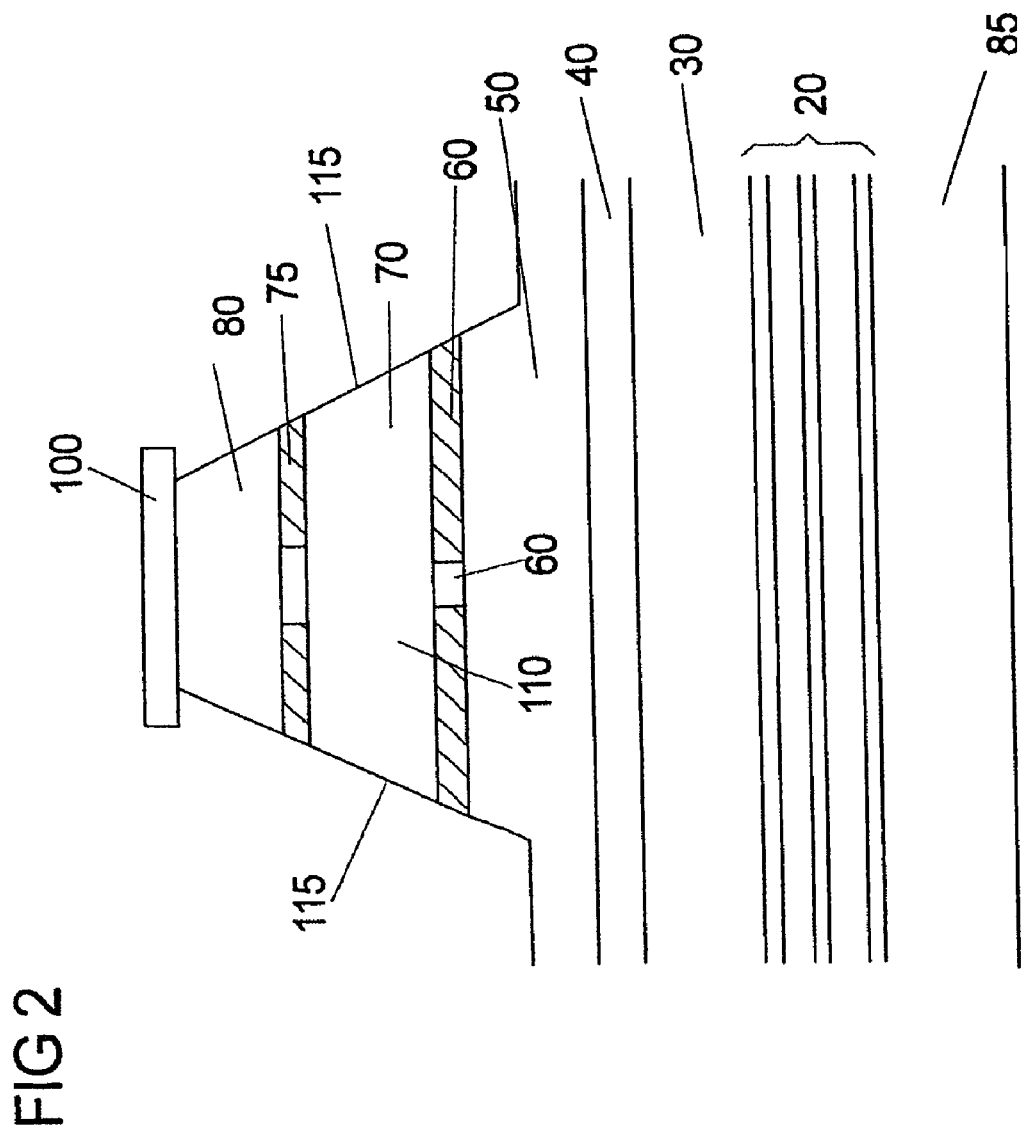

The semiconductor layer stack 10 illustrated in FIG. 1 is subjected to an etching step, thereby forming the mesa structure 110 illustrated in FIG. 2. It can be seen that the mask layer 100 is slightly undercut.

The sidewalls 115 of the mesa structure 110 are subsequently subjected to an oxidation step. Particularly current aperture layer 60 and also the oxidizable auxiliary layer 75 oxidize in this case, since these two layers are particularly disposed to oxidation. If the semiconductor layer stack 10 is a III/V semiconductor material system based on GaAs, then the oxidizable auxiliary layer 75 and the current aperture layer 60 have a correspondingly high aluminum content, for example, since the proportion of aluminum critically determines the oxidation rate in gallium arsenide layers.

The oxidized region of the oxidizable auxiliary layer 75 and the oxidized region of the current aperture layer 60 are indicated by hatching in FIG. 2. It can be seen that oxidation is effected significantly "deeper" into the oxidizable auxiliary layer 75 and into the oxidized region of the current aperture layer 60 than into the remaining layers 50, 70 and 80 of the mesa structure 110.

A current aperture 60' of the laser forms in the current aperture layer 60 as a result of the oxidation; the position of a semiconductor relief of the laser is defined in the oxidizable auxiliary layer 75 as a result of the oxidation—as will become clear below.

An automatic "self-scaling" thus takes place with regard to the position of the current aperture 60' and the position of the semiconductor relief, since the current aperture 60' and the semiconductor relief are defined during the same production step.

In a subsequent step, a further (second) mask layer 120—preferably a photoresist mask—is applied to the oxidized mesa structure 110 and also to the (first) mask layer 100 and patterned. The resulting structure is shown in FIG. 3.

The resulting structure is subsequently subjected to an etching step which cuts through both the first mask layer 100 and through the covering layer 80. The etching step is ended on the oxidizable auxiliary layer 75. The etching step is preferably carried out as a "selective" etching step, so that the etching of the covering layer 80 is ended automatically.

Figure 3:
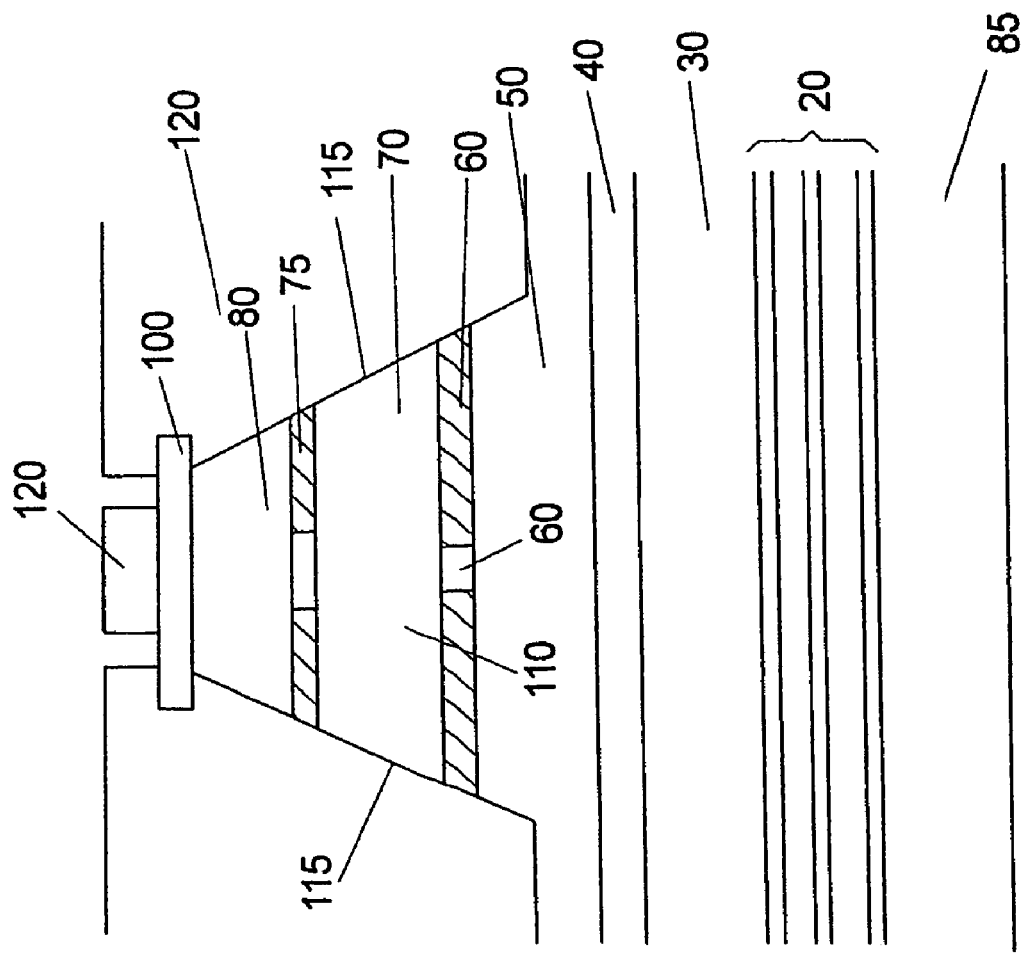
Figure 4:
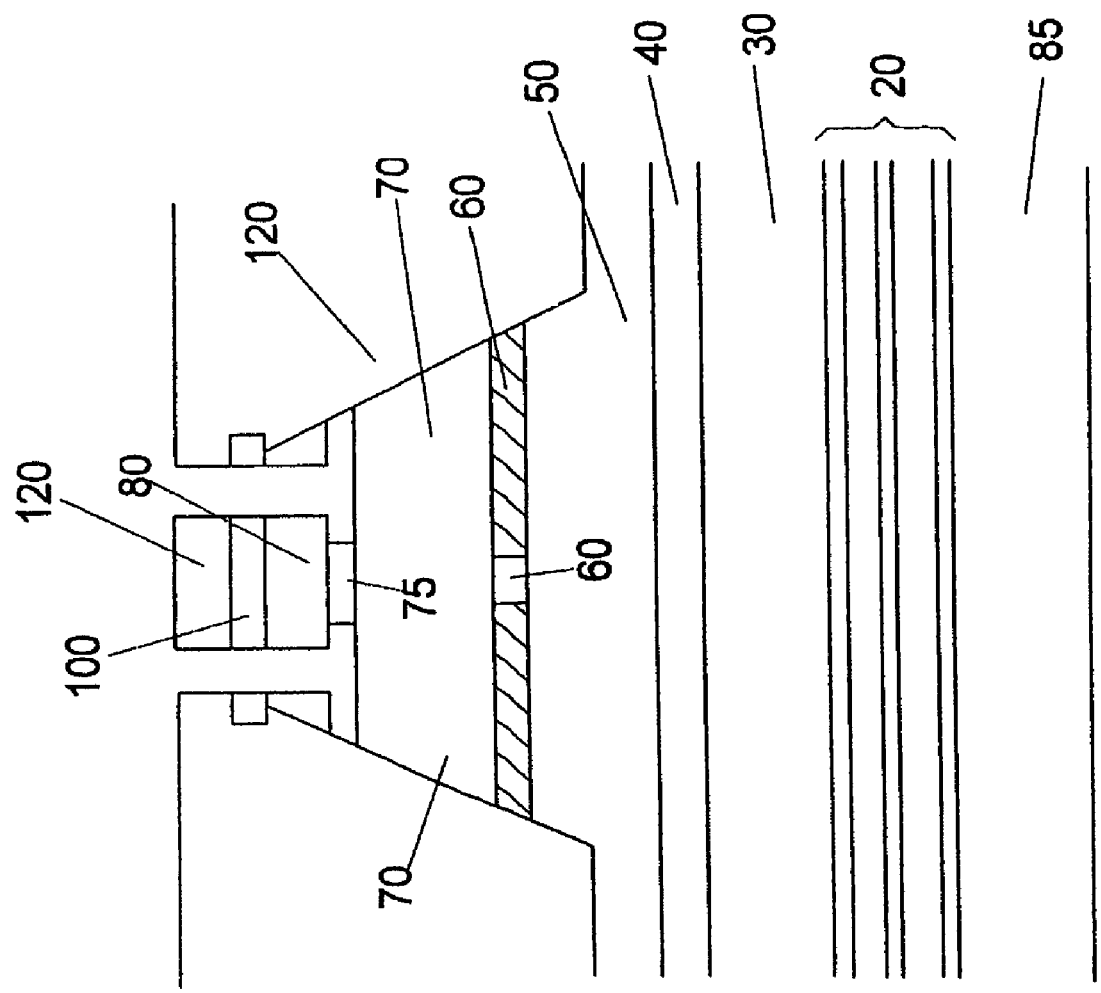

Afterward, the oxidized region—that is to say the hatched region in FIG. 3—of the oxidizable auxiliary layer 75 is removed selectively. The structure illustrated in FIG. 4 is formed, in the case of which the semiconductor intermediate layer 70 has been uncovered at those locations at which the oxidizable auxiliary layer 75 had previously been oxidized.

Figure 5:
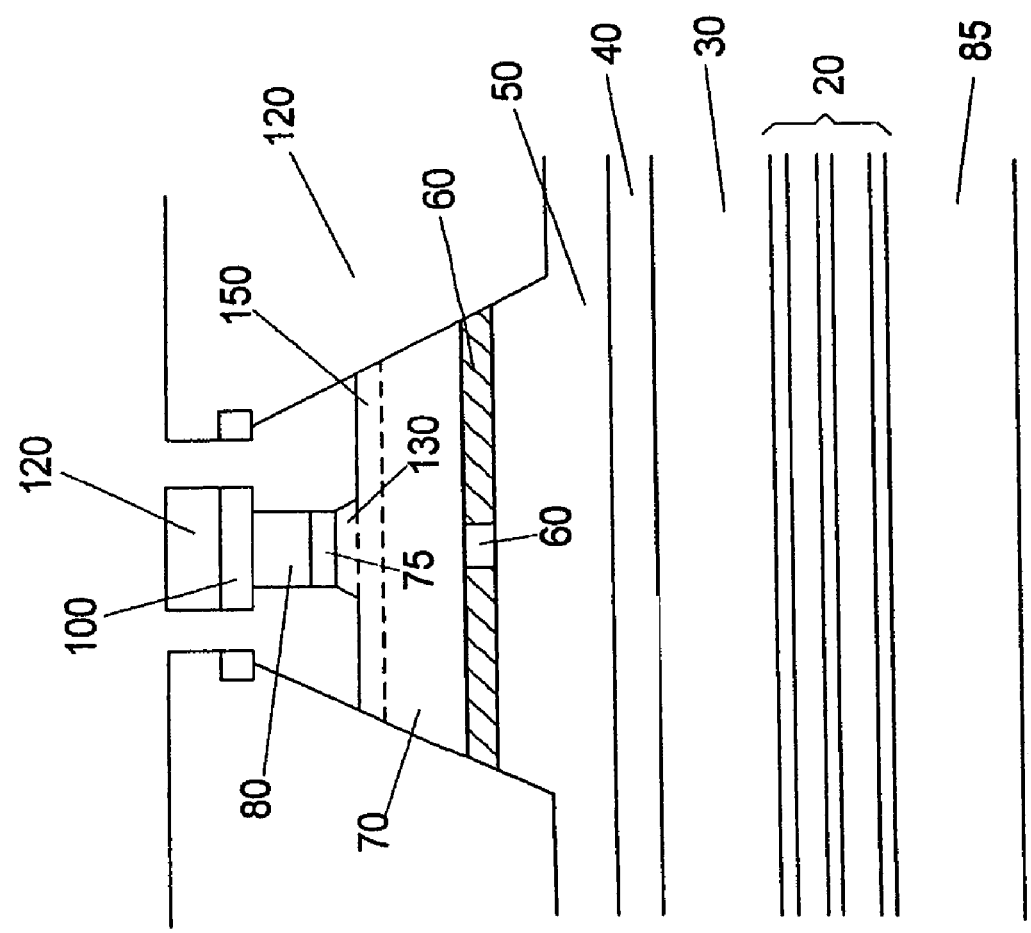

Etching is subsequently effected into the semiconductor intermediate layer 70, so that a raised region, called semiconductor relief 130 hereinafter, is formed in the semiconductor intermediate layer 70. The resulting structure is shown in FIG. 5.

The step of etching into the semiconductor intermediate layer 70 may be carried out wet-chemically, for example. In order to achieve an automatic etching stop in the semiconductor intermediate layer 70, a highly doped contact layer, for example, may be integrated therein, the etching step stopping automatically on said contact layer. The highly doped contact layer is indicated by dashed lines in FIG. 5 and provided with the reference symbol 150.

The etching depth in the course of etching the semiconductor intermediate layer 70 is chosen in such a way as to produce a semiconductor relief in the case of which higher modes of the VCSEL laser to be formed are suppressed to a sufficient extent.

Figure 6:
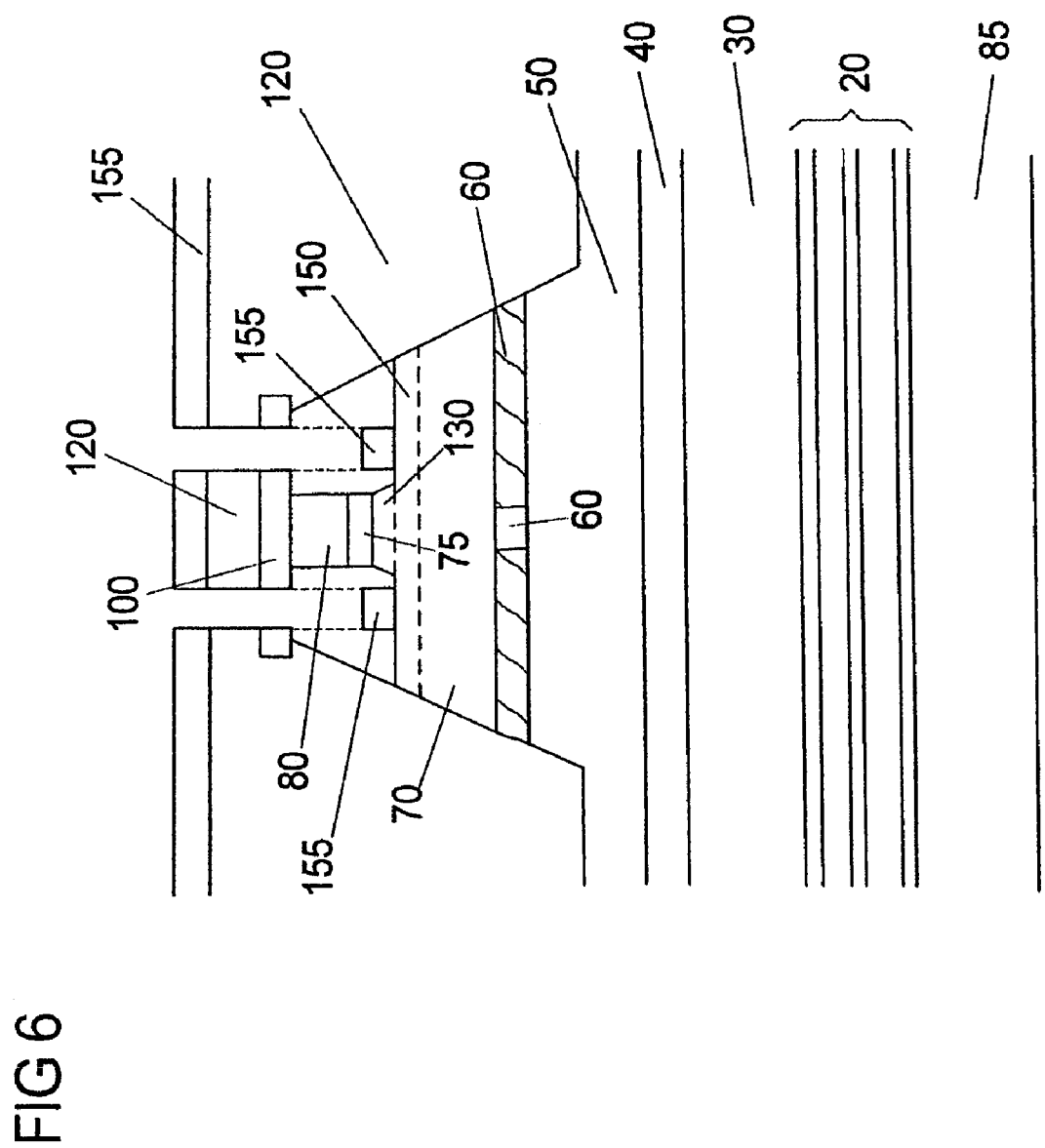

Afterward, a metal contact layer 155 is deposited, for example by vapor deposition, on the mesa structure 110 using the second mask layer 120. The resulting structure is shown in FIG. 6.

Afterward, the further mask layer 120 and also the non-oxidized region of the oxidizable auxiliary layer 75 are removed selectively, as a result of which the covering layer 80 that remains on the auxiliary layer 75 and also the metallization present on the further mask layer 120 are lifted off. The semiconductor structure illustrated in FIG. 7 with a semiconductor relief 130 in the semiconductor intermediate layer 70 is formed.

An annular metal contact 160 is formed by the residual metal contact layer 155 on the semiconductor intermediate layer 70.

Figure 7:
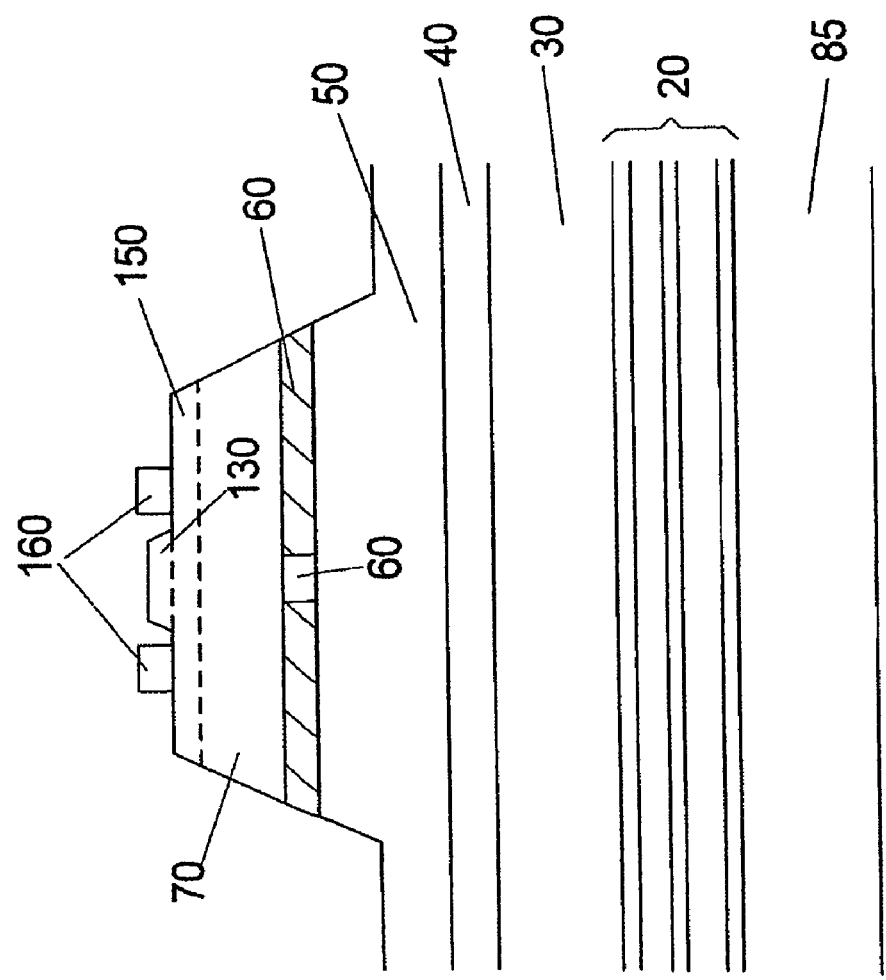
Figure 8:
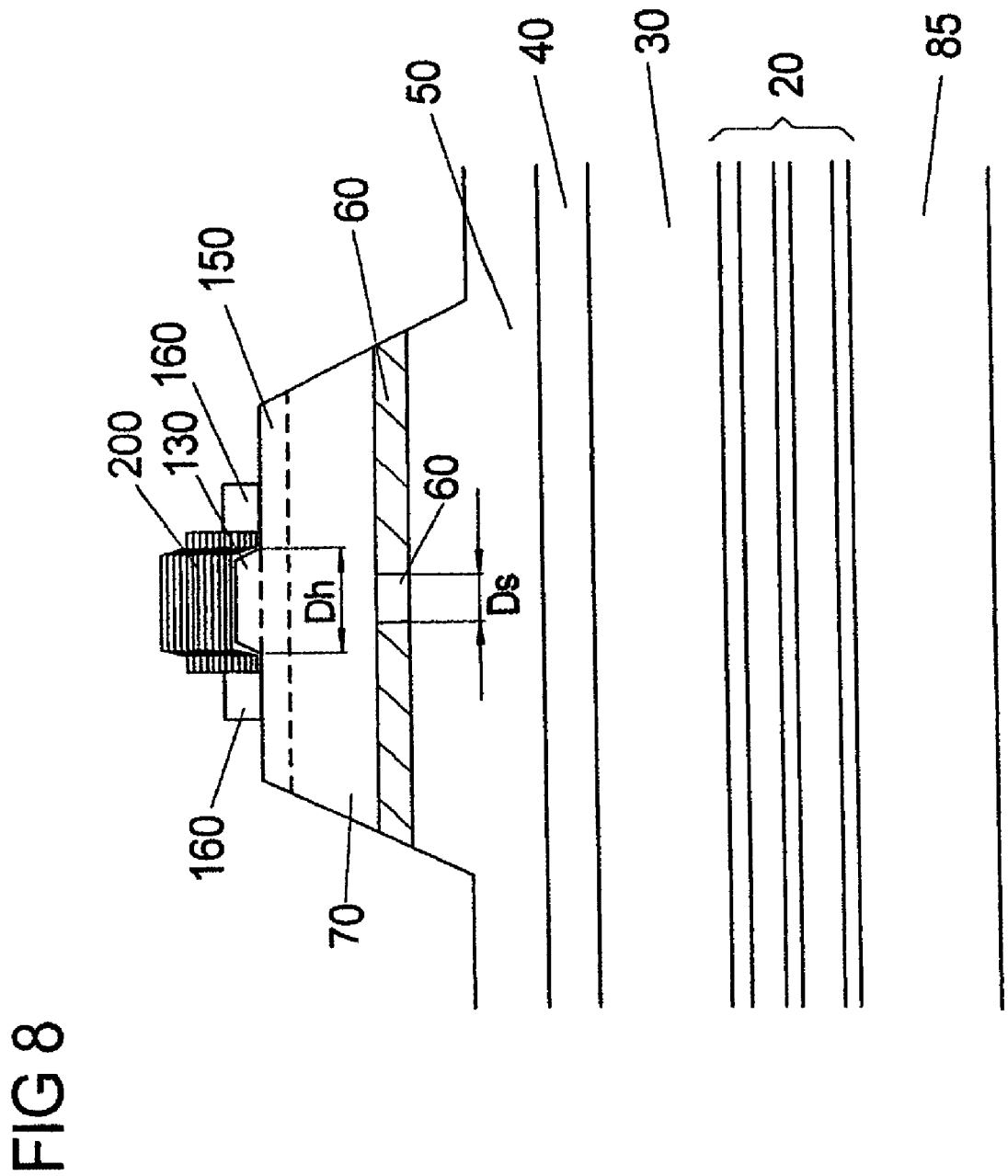

A mirror layer or a mirror layer stack 200 is subsequently applied to the mesa structure in accordance with FIG. 7. This may be effected in the context of a "lift-off" method or in the context of a patterning method. The resulting VCSEL laser is shown in FIG. 8.

Since the annular metal contact 160 makes contact with a semiconductor layer below the mirror layer or the mirror layer stack 200 and is thus situated in the "cavity region" of the laser, the annular metal contact 160 forms a so-called "intra-cavity contact".

The second electrical contact required for the VCSEL laser may be arranged—provided that the lower mirror layer stack 20 is conductive—for example on the rear side of the substrate 85; as an alternative, the second electrical contact may be provided as an alloying "intra-cavity contact" on the lower weakly doped laser layer 30.

As can be gathered from the explanations above, the area size or the diameter Ds of the current aperture 60' in the current aperture layer 60 and also the area size or the diameter Dh of the semiconductor relief 130 in the semiconductor intermediate layer 70 are determined by the oxidation step to which the sidewalls 115 of the mesa structure 110 are subjected in accordance with FIG. 2. If production fluctuations or production tolerances then occur during the oxidation step, the area size or the diameter Ds of the current aperture and also the area size or the diameter Dh of the semiconductor relief 130 will fluctuate. However, since the current aperture 60' and also the semiconductor relief 130 are produced during the same oxidation step, a virtually fixedly predetermined ratio between the area size of the current aperture and the area size of the semiconductor relief 130 will be formed. The ratio Ds/Dh will thus remain largely constant even in the event of production fluctuations. An effect of "self-scaling" thus occurs.

In addition, a "self-alignment" between the current aperture 60' and the semiconductor relief 130 also results, since the position of the current aperture 60' and the position of the semiconductor relief 130 are defined by the same mask step.

FIGS. 9 to 16 show a second exemplary embodiment of the invention. The semiconductor layer stack 10 arranged on the substrate 85 can be seen.

Figure 9:
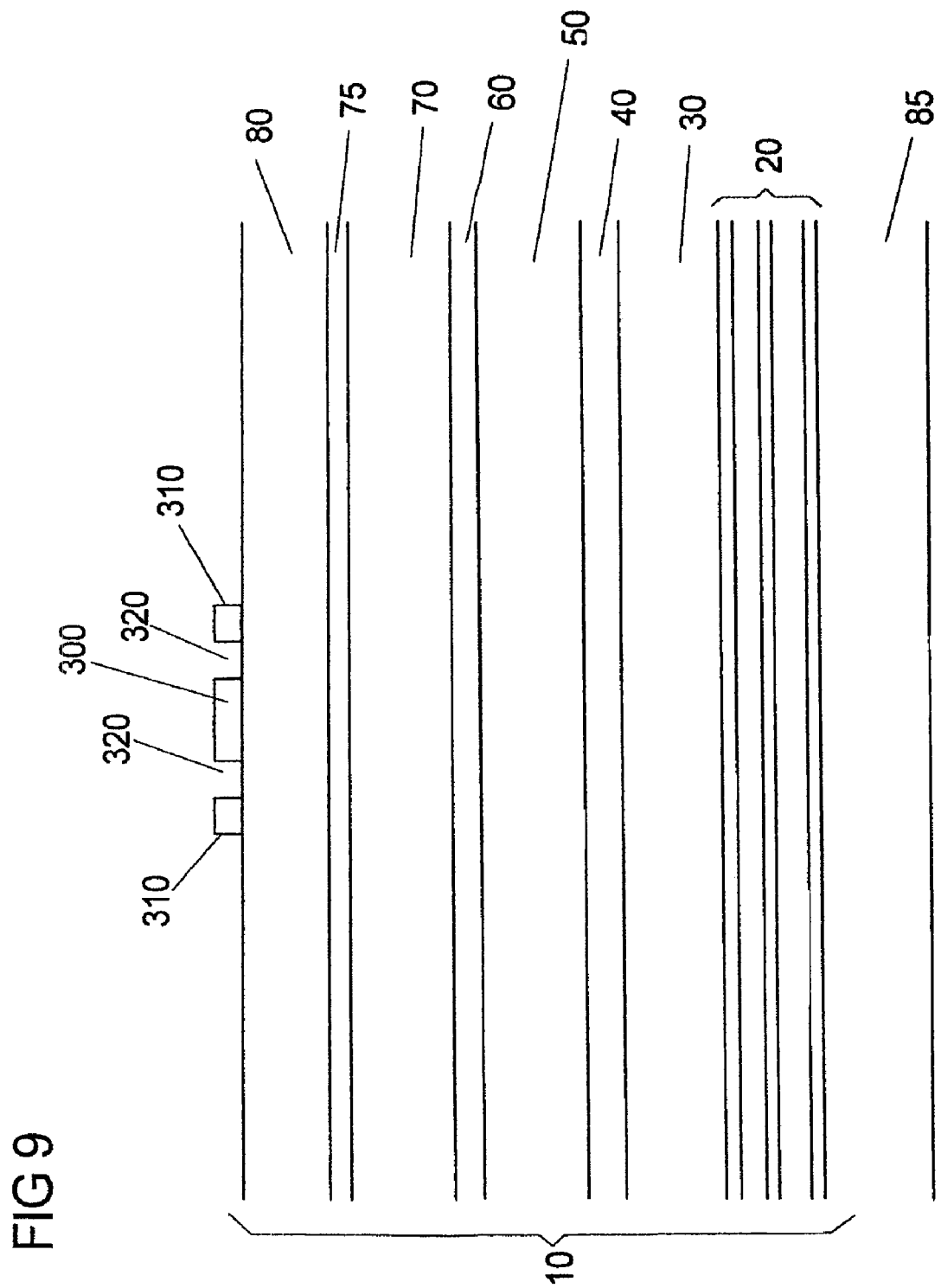
FIGS. 9–16 show a second exemplary embodiment of the method according to the invention and a laser according to the invention on the basis of diagrammatic illustrations.

A first mask 300—preferably a hard mask—is applied to the semiconductor layer stack 10, the outer edge 310 of which mask will define the mesa structure of the VCSEL laser (cf. FIG. 9). There is an annular cutout present in the inner region of the mask 300—which cutout is identified by the reference symbol 320 and will subsequently define the annular metal contact 160 in accordance with FIG. 7.

Figure 10:
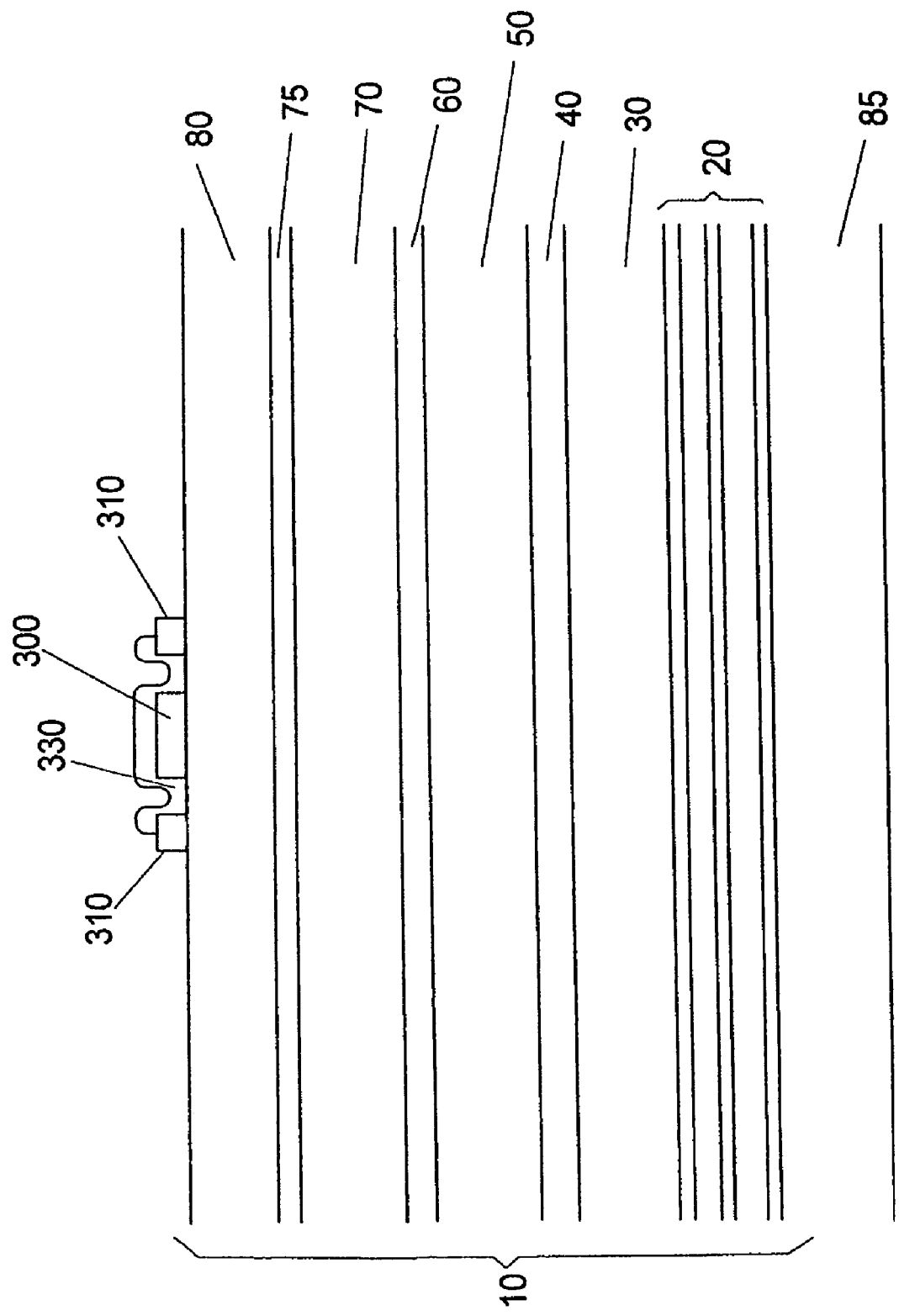

In a second masking step, the annular cutout 320 is covered with a second mask 330—preferably a photoresist mask—thereby producing the structure illustrated in FIG. 10.

A mesa structure 110 is subsequently etched into the semiconductor layer stack 10. The diameter of the mesa structure 110 is defined by the outer edge 310 of the first mask 300.

Figure 11:
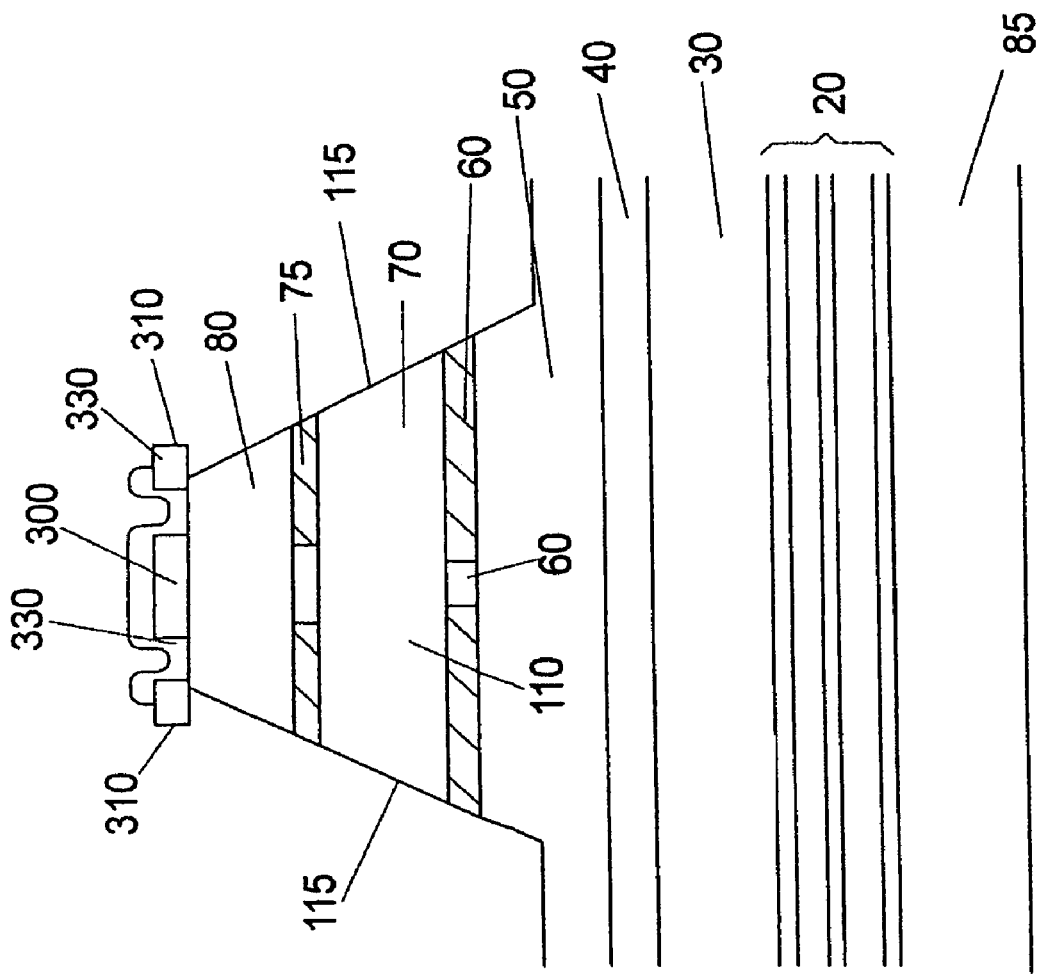

Afterward, the sidewalls 115 of the mesa structure 110 are oxidized. The structure shown in FIG. 11 is formed, corresponding to the structure in accordance with FIG. 2 apart from the configuration of the upper masks 300 and 330.

Figure 12:
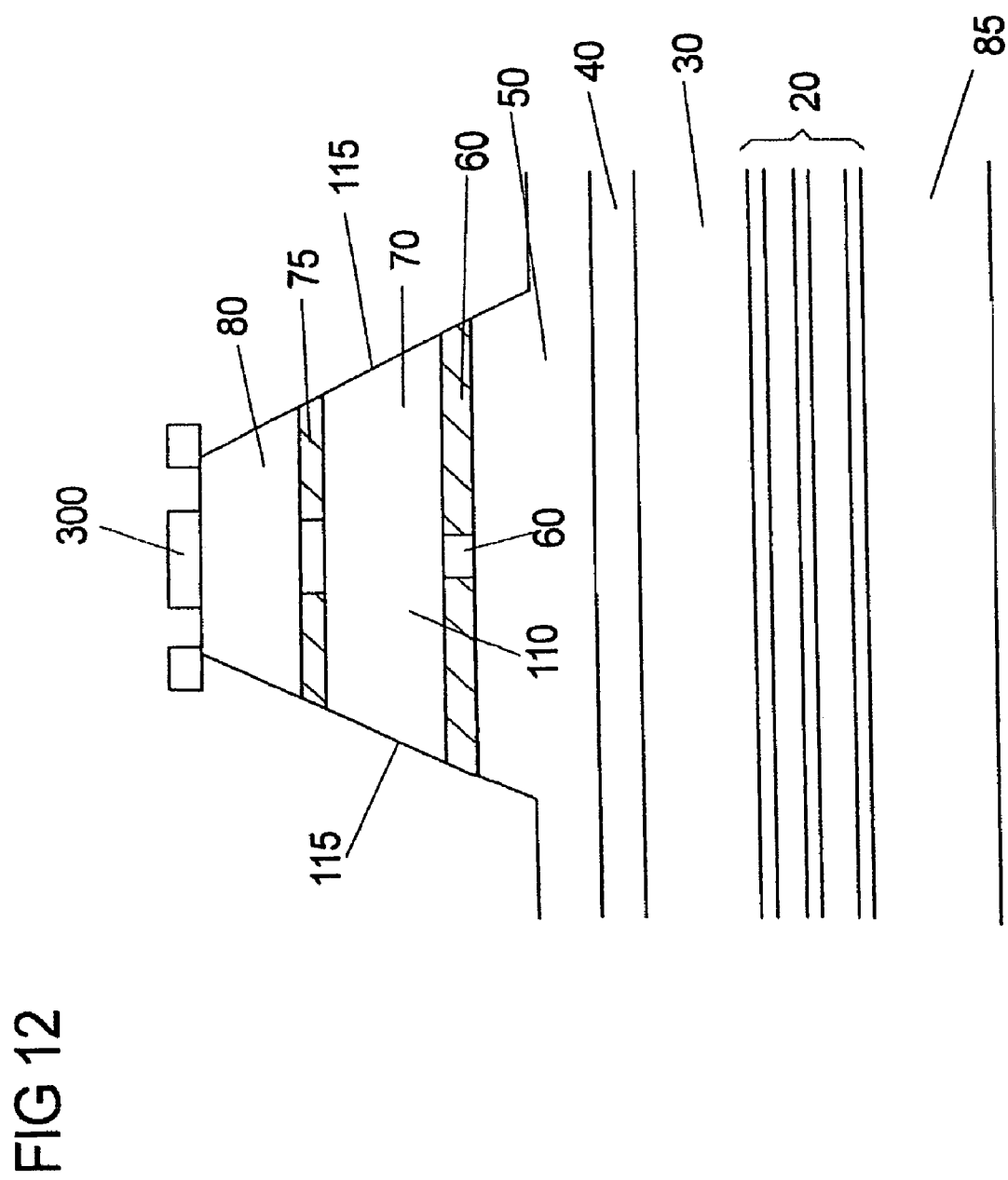

The second mask 330 is subsequently removed to form the structure in accordance with FIG. 12.

Figure 13:
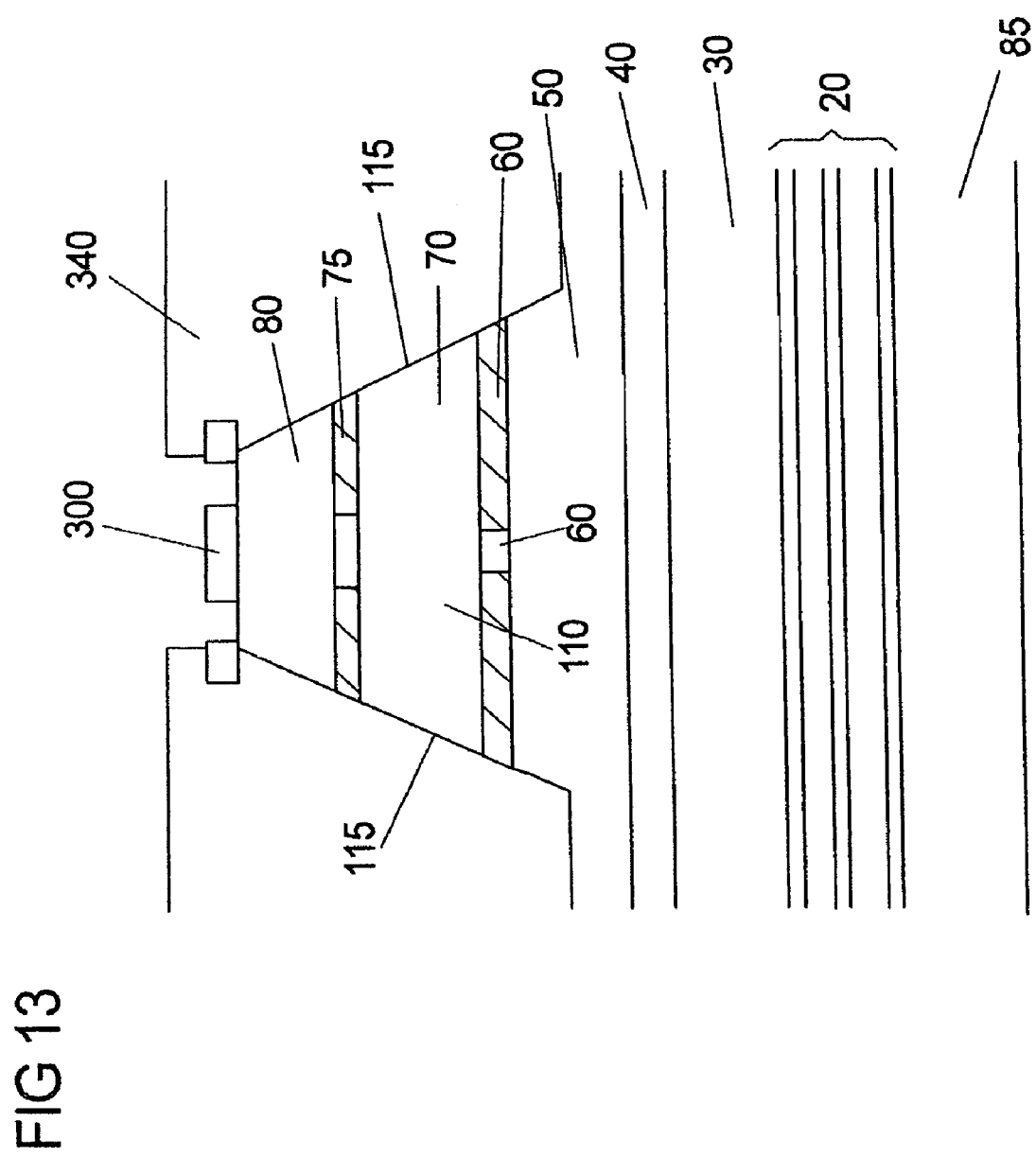

FIG. 13 shows the resulting layer stack after a third mask 340—preferably a photoresist mask—has been applied. The third mask serves for covering or protecting the sidewalls 115 of the mesa structure 110.

Figure 14:
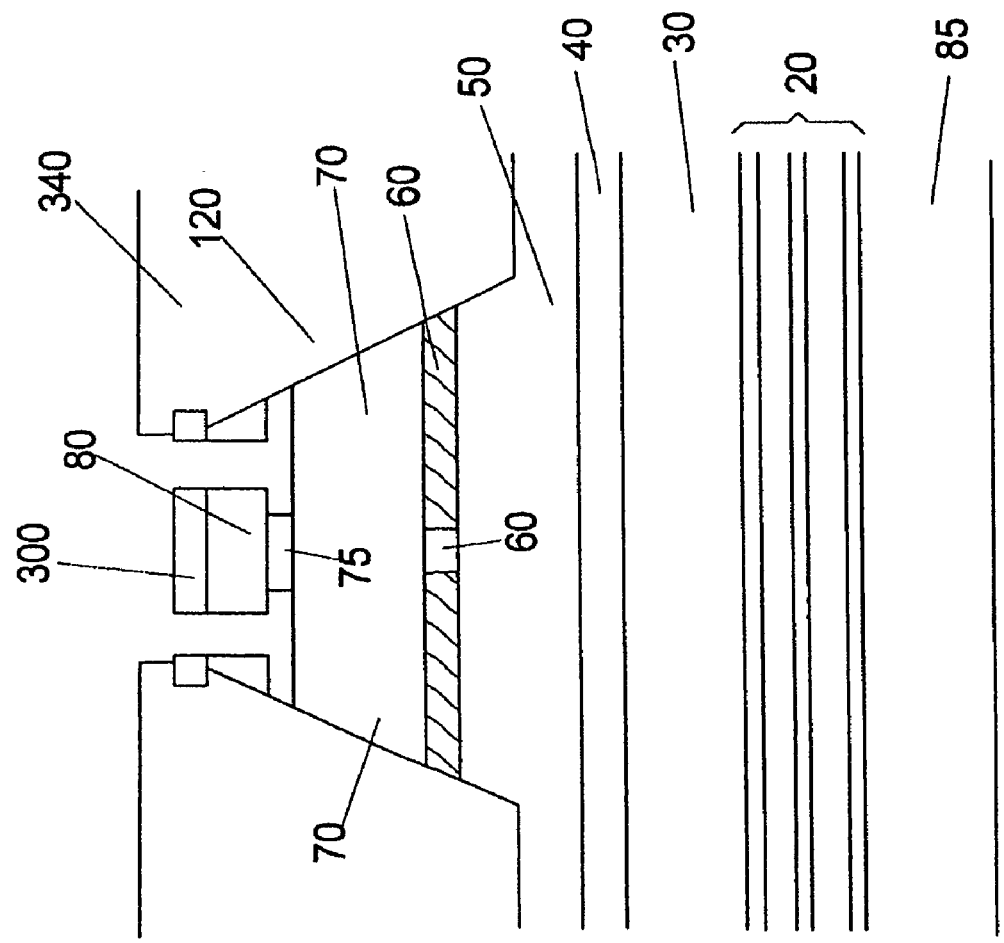

The resulting structure is subsequently subjected to an etching step which cuts through the covering layer 80. The etching step is ended on the oxidizable auxiliary layer 75. The oxidized region, that is to say the hatched region in FIG. 13, of the oxidizable auxiliary layer 75 is subsequently removed selectively. The structure illustrated in FIG. 14 is formed, in the case of which the semiconductor intermediate layer 70 has been uncovered at those locations at which the oxidizable auxiliary layer 75 had previously been oxidized.

Figure 15:
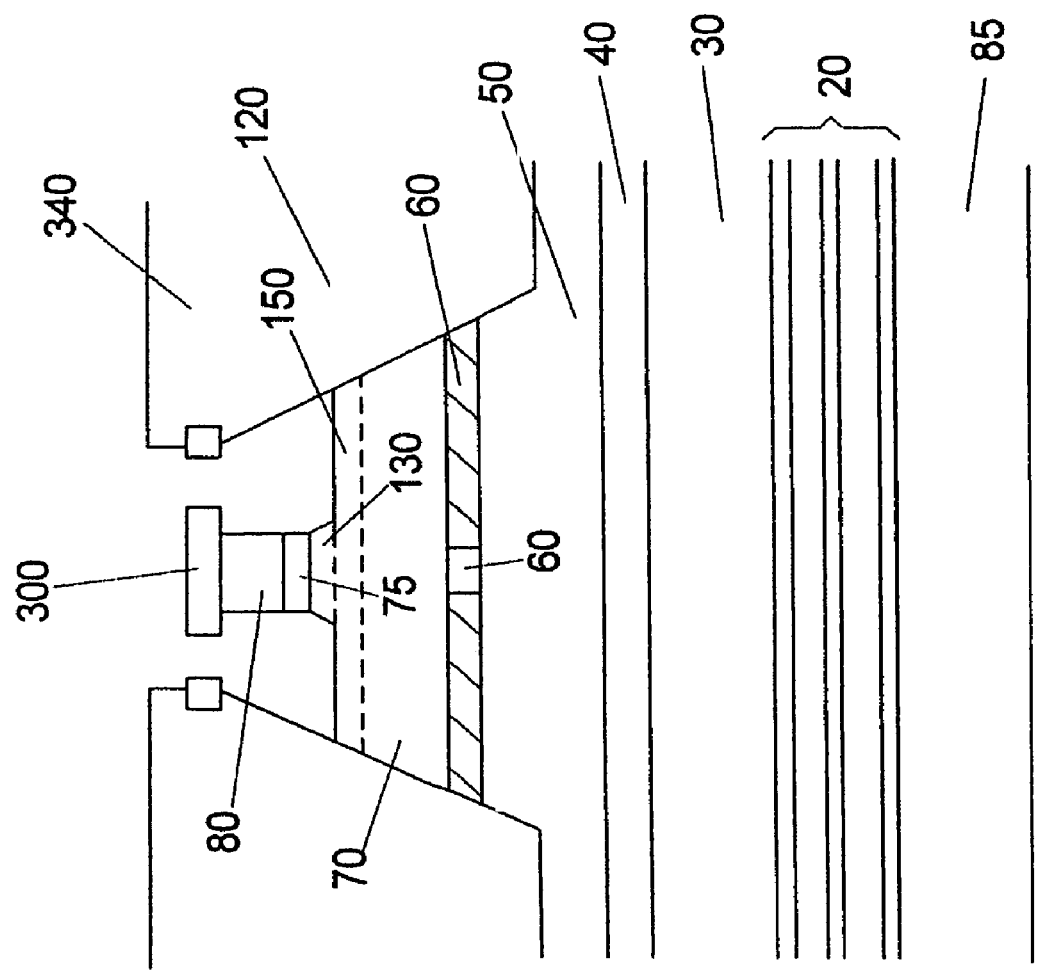

Etching is subsequently effected into the semiconductor intermediate layer 70, so that the semiconductor relief 130 is formed in the semiconductor intermediate layer 70. The resulting structure is shown in FIG. 15.

Figure 16:
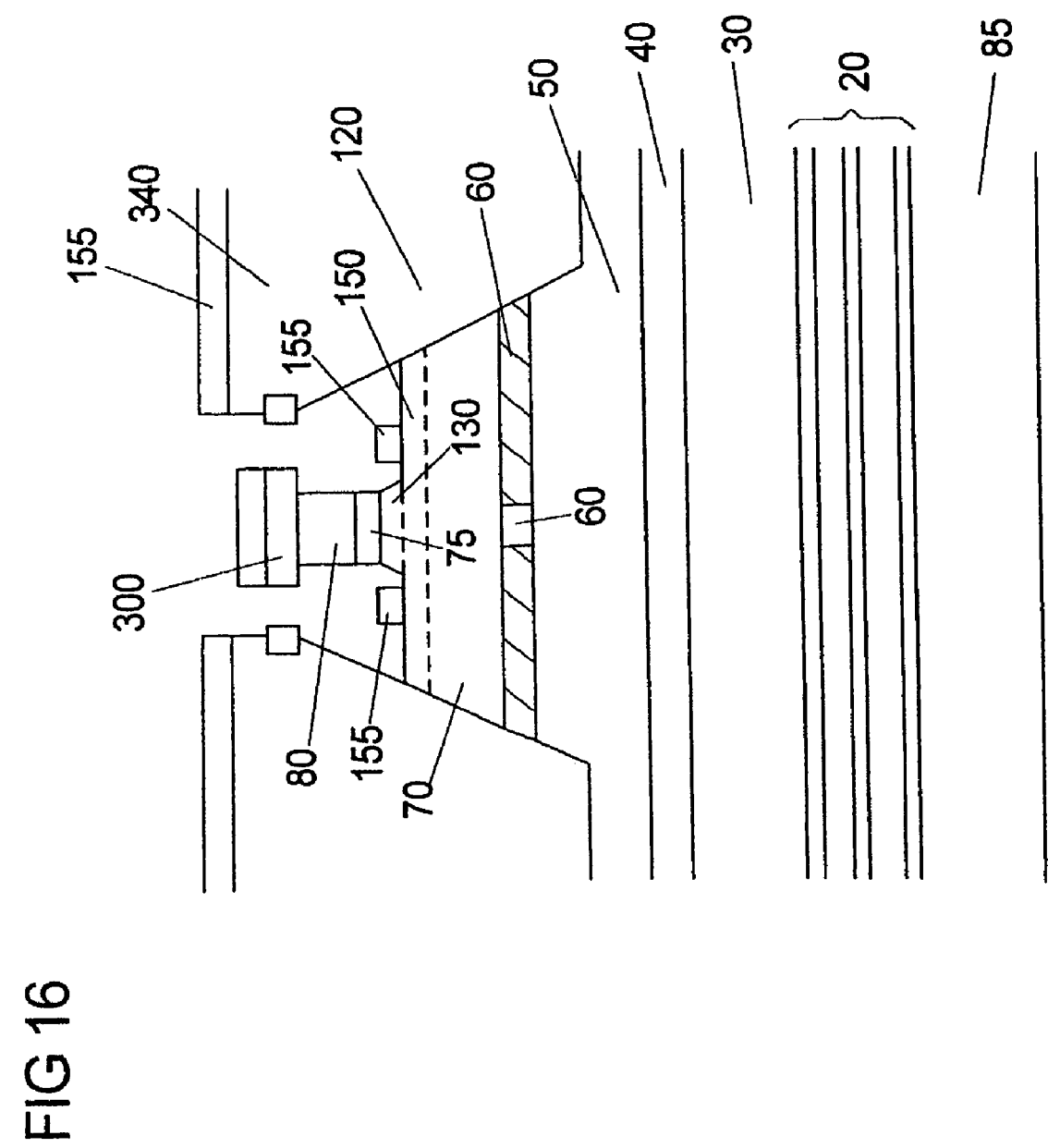
Figure 17:
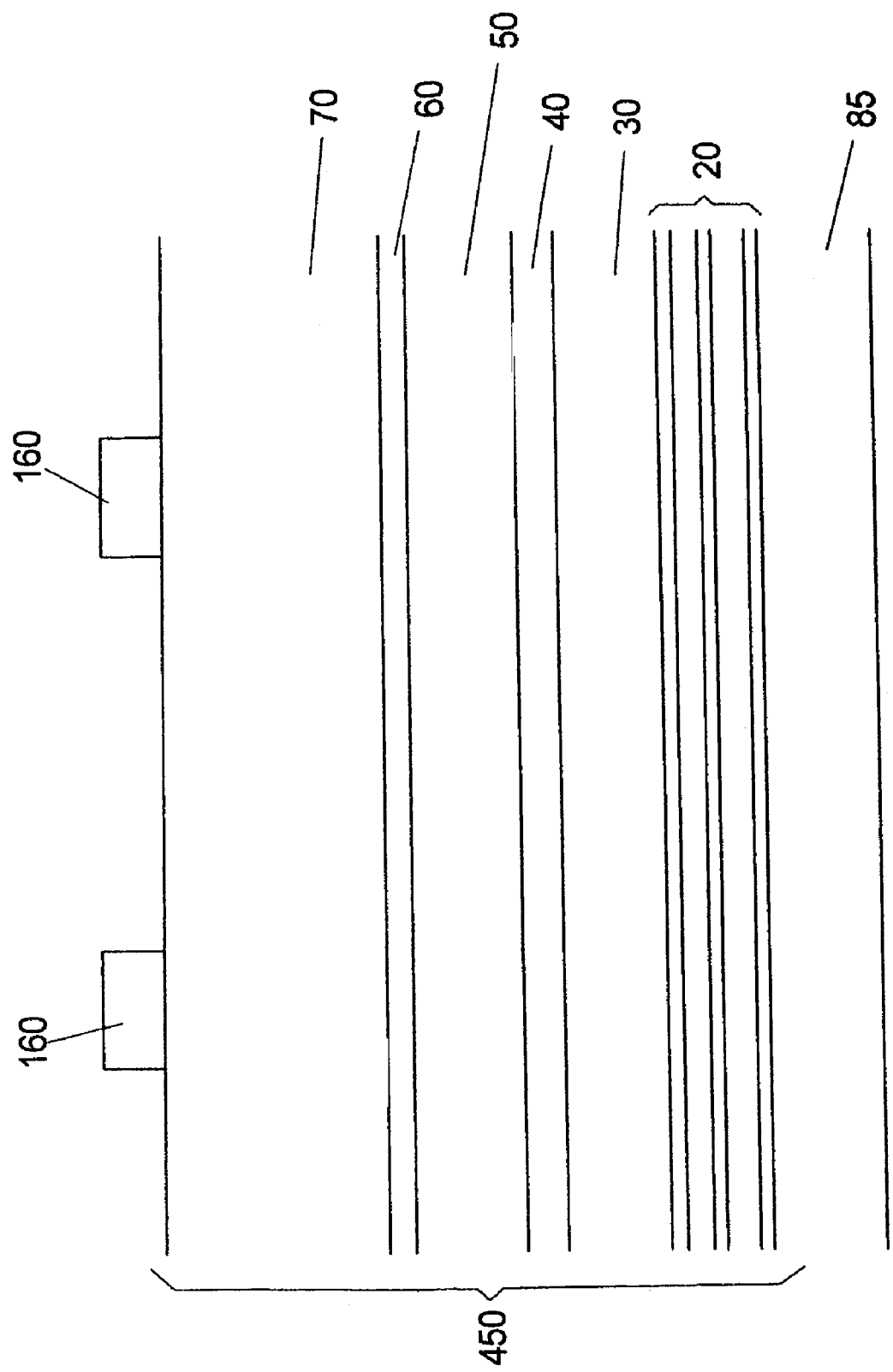
Figure 18:
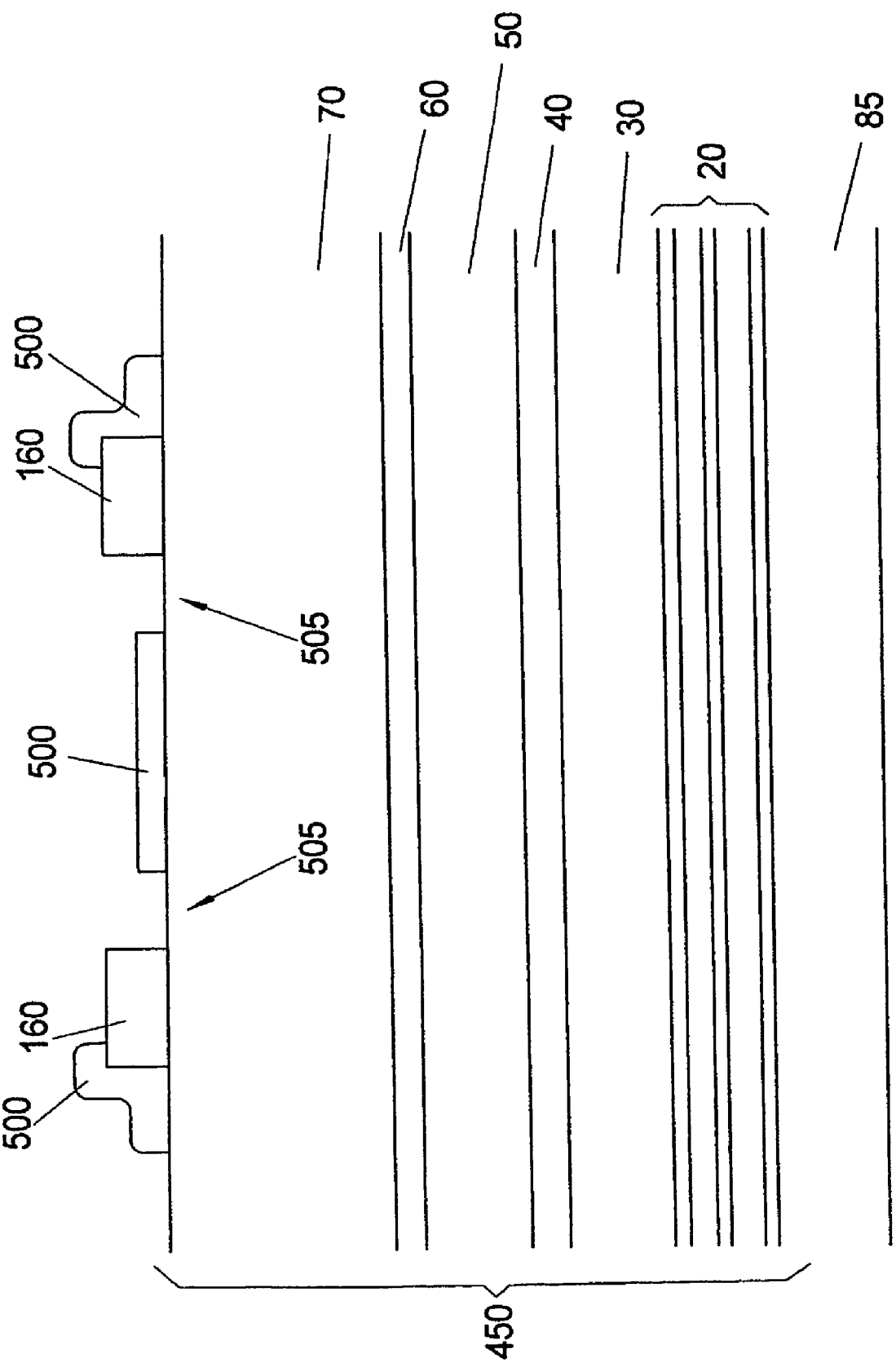

The step of etching into the semiconductor intermediate layer 70 may be carried out wet-chemically, for example. In order to achieve an automatic etching stop in the semiconductor intermediate layer 70, a highly doped contact layer 150, for example, may be integrated therein, the etching step stopping automatically on said contact layer. A metal contact layer 155 is subsequently deposited, for example by vapor deposition, on the mesa structure 110 using the third mask 340. The resulting structure is shown in FIG. 16.

The first and third masks 300 and 340 and also the non-oxidized region of the oxidizable auxiliary layer 75 are subsequently removed selectively, as a result of which the covering layer 80 that remains on the auxiliary layer 75 and also the metallization present on the third mask 340 are lifted off. The semiconductor structure already illustrated in FIG. 7 with a semiconductor relief 130 in the semiconductor intermediate layer 70 is formed. An annular metal contact 160 is formed by the residual metallization 155 on the highly doped contact layer 150 of the semiconductor intermediate layer 70.

A mirror layer or a mirror layer stack 200 is subsequently applied to the mesa structure in accordance with FIG. 7, as has already been explained in connection with FIG. 8. The VCSL laser is thus completed.

The second exemplary embodiment of the invention—in the same way as the first exemplary embodiment—affords self-alignment and self-scaling between the current aperture 60' and the semiconductor relief 130 since the position and the size of the current aperture 60' and the position and the size of the semiconductor relief 130 are defined by the same mask step and the same oxidation step. Moreover, in contrast to the first exemplary embodiment of the invention, the position of the annular metal contact 160 is additionally self-aligned relative to the current aperture 60' and to the semiconductor relief 130 since the position of the annular metal contact 160 is determined by the first mask 300, which also simultaneously defines the position of the mesa structure. Three components, namely the metal contact 160, the current aperture 60' and the semiconductor relief 130 are thus self-aligned.

A third exemplary embodiment of the invention is explained below in connection with FIGS. 17 to 23.

First of all, an annular metal contact 160 is vapor-deposited onto a semiconductor layer stack 450, for example by means of a lift-off method. The semiconductor layer stack 450 corresponds—apart from the missing oxidizable auxiliary layer 75 and the missing covering layer 80—to the semiconductor layer stack 10 in accordance with FIG. 1 (cf. FIG. 17).

A first mask 500—preferably a hard mask made of oxide or made of nitride, for example—is subsequently applied. The first mask 500 has an annular cutout 505, the inner region of which will define a semiconductor relief 130 (cf. FIG. 18).

Figure 19:
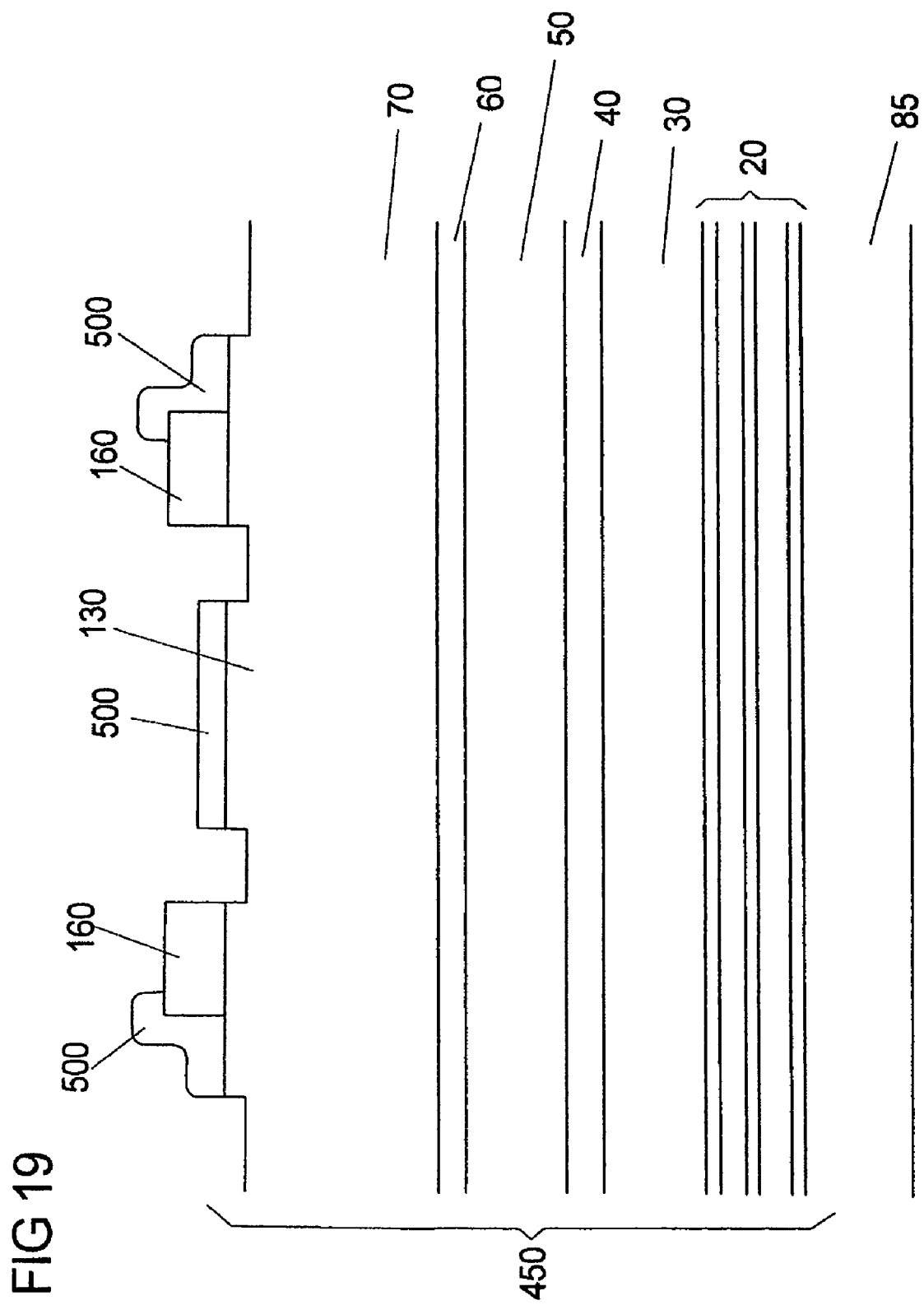
Figure 20:
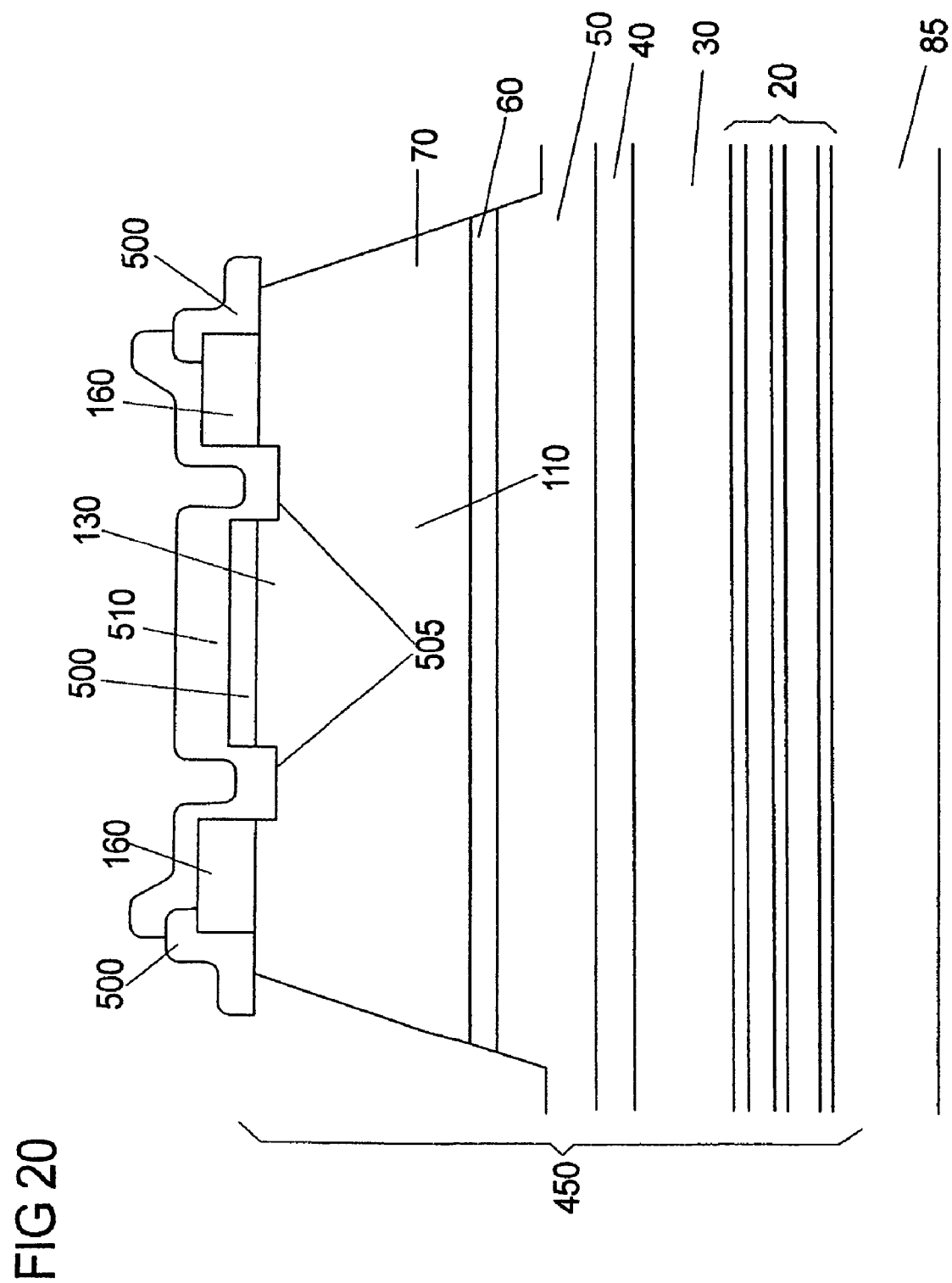
Figure 21:
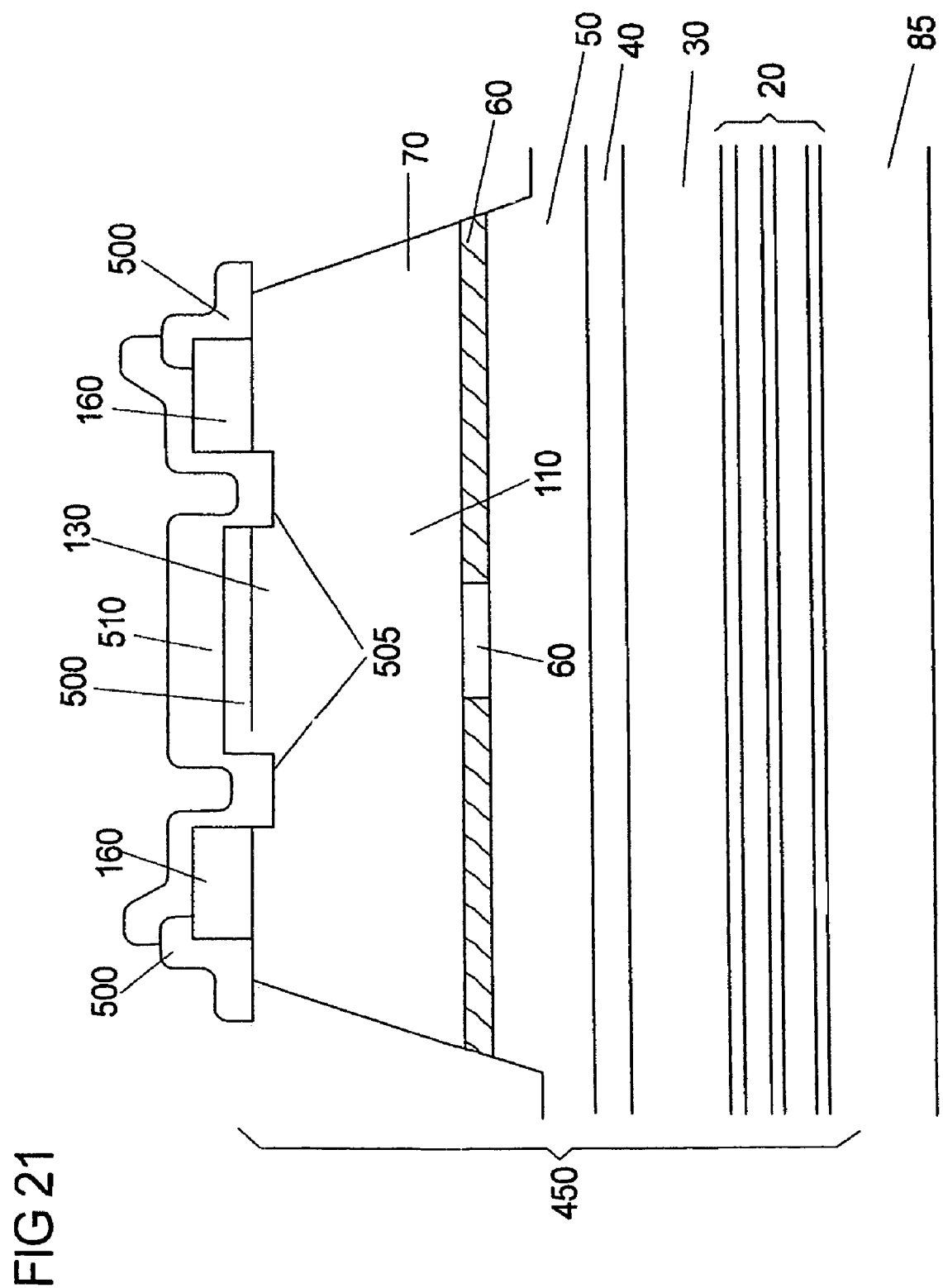

An etching step is subsequently carried out, which forms the semiconductor relief 130 below the central region of the mask 500 (cf. FIG. 19).

A second mask 510—preferably a photoresist mask—is subsequently applied in such a way that the annular cutout 505 of the first mask 500 is covered. The mesa structure 110 of the laser is then produced by means of an etching step (cf. FIG. 20).

Afterward, the second mask 510 is removed and the mesa structure is oxidized. The semiconductor relief 130 is thus completed in a self-aligned manner with respect to the current aperture 60' (cf. FIG. 21).

The first mask 500 is also removed in the further course of the process, thereby producing the structure shown in FIG. 22.

Afterward, on the semiconductor relief 130, an upper mirror layer stack 200 is either applied over the whole area and patterned or produced by means of a lift-off method. The VCSEL laser is thus completed.

The third exemplary embodiment affords the self-alignment—already explained in connection with the first exemplary embodiment—between the current aperture 60' and the semiconductor relief 130 since both the position of the mesa structure 110 and thus the position of the current aperture 60' and the position of the semiconductor relief 130 are defined by the same mask. By contrast, a self-alignment with regard to the annular metal contact 160 does not occur.

In the case of the above three exemplary embodiments of the invention, the semiconductor relief 130 is arranged by way of example between the upper mirror layer stack 200 and the current aperture 60'. The area ratio Ds/Dh is by way of example less than 1; this means that the area size (Dh) of the semiconductor relief is chosen to be larger than the area size (Ds) of the current aperture.

REFERENCE SYMBOLS

10 Semiconductor layer stack
20 Lower mirror layer stack
30 Lower weakly doped laser layer
40 Active laser layer
50 Upper weakly doped laser layer
60 Current aperture layer
60' Current aperture
70 Semiconductor intermediate layer
75 Oxidizable auxiliary layer
80 Covering layer
85 Substrate
100 Mask layer
110 Mesa structure
115 Sidewalls
120 Second mask layer
130 Semiconductor relief
150 Highly doped contact layer
155 Metal contact layer
160 Annular metal contact
200 Mirror layer stack 300 First mask
310 Outer edge 310
320 Annular cutout
330 Second mask
340 Third mask
450 Semiconductor layer stack
500 First mask
505 Annular cutout
510 Second mask

The invention claimed is:

1. A method of producing a vertically emitting laser, comprising:
   forming a semiconductor layer stack over a substrate; and
   processing the semiconductor layer stack, thereby forming a current aperture and a semiconductor relief associated with the vertically emitting laser, wherein an area of the current aperture and an area of the semiconductor relief are defined in a same processing operation.

2. The method of claim 1, wherein the same processing operation results in the areas of the current aperture and the semiconductor relief to comprise a predetermined size ratio that is substantially self-scaling with respect to processing variations.

3. The method of claim 2, wherein the same processing operation comprises an oxidation of a plurality of layers within the semiconductor layer stack.

4. The method of claim 3, wherein the semiconductor layer stack comprises an oxidizable auxiliary layer and an oxidizable current aperture layer, and wherein the oxidation of the plurality of layers within the semiconductor layer stack causes an oxidation of peripheral portions of the oxidizable auxiliary layer and the oxidizable current aperture layer, and wherein the predetermined size ratio is defined by an oxidation rate of the oxidizable auxiliary layer and the oxidizable current aperture layer, respectively.

5. The method of claim 4, wherein processing the semiconductor layer stack further comprises forming a mesa structure associated with at least a portion of the semiconductor layer stack prior to the oxidation, wherein the oxidizable auxiliary layer and the oxidizable current aperture layer comprise a portion of the mesa structure.

6. The method of claim 5, wherein the semiconductor layer stack comprises:
   the oxidizable current aperture layer overlying the substrate;
   at least one semiconductor intermediate layer overlying the oxidizable current aperture layer;
   the oxidizable auxiliary layer overlying the at least one semiconductor intermediate layer; and
   a covering layer overlying the oxidizable auxiliary layer,
   wherein forming the mesa comprises patterning the oxidizable current aperture layer, the at least one semiconductor intermediate layer, the oxidizable auxiliary layer and the covering layer, and
   wherein the oxidation results in an oxidation of patterned peripheral portions of the oxidizable current aperture layer and the oxidizable auxiliary layer.

7. The method of claim 6, further comprising:
   removing oxidized portions of the oxidized auxiliary layer, thereby exposing a portion of the underlying at least one semiconductor intermediate layer;
   etching the exposed portion of the at least one semiconductor intermediate layer down to a predetermined depth, thereby forming the semiconductor relief therein, wherein the predetermined etch depth corresponds to a height of the semiconductor relief; and
   removing the covering layer and a non-oxidized portion of the auxiliary layer, thereby exposing the semiconductor relief.

8. The method of claim 7, further comprising forming at least one mirror layer over the semiconductor relief.

9. The method of claim 1, further comprising forming an upper mirror layer overlying the semiconductor layer stack, wherein the semiconductor relief is arranged between the upper mirror layer and the current aperture.

10. The method of claim 9, wherein the area of the semiconductor relief is greater than the area of the current aperture.

11. The method of claim 9, wherein forming the upper mirror layer comprises depositing a dielectric layer over the processed semiconductor layer stack.

12. The method of claim 1, further comprising:
   patterning the semiconductor layer stack to form a mesa structure including the current aperture and the semiconductor relief included therein; and
   forming an upper electrical contact of the laser on a top portion of the mesa structure,
   wherein the upper electrical contact, the current aperture, and the semiconductor relief are arranged relative to one another in a self-aligned manner.

13. The method of claim 12, wherein the upper electrical contact comprises an intra-cavity contact.

14. The method of claim 12, wherein patterning the semiconductor layer stack to form the mesa structure comprises exposing apportion of a semiconductor intermediate layer, and further comprising forming an intra-cavity contact on the exposed portion of the semiconductor intermediate layer.

15. A method of forming a vertically emitting laser, comprising:
   forming a base portion comprising a substrate, and a photon generating portion overlying the substrate;
   forming an oxidizable current aperture layer over the base portion;
   forming a semiconductor intermediate layer over the current aperture layer;
   forming an oxidizable auxiliary layer over the semiconductor intermediate layer;
   forming a covering layer over the oxidizable auxiliary layer;
   forming a first mask over the covering layer;
   patterning the covering layer, the oxidizable auxiliary layer, the semiconductor intermediate layer, and the oxidizable current aperture layer using the first mask to form a mesa structure;
   oxidizing the mesa structure, thereby causing peripheral portions of the oxidizable current aperture layer and the oxidizable auxiliary layer to become oxidized, and further causing non-oxidized portions of the current aperture layer and the auxiliary layer to be self-aligned and self-scaled with respect to one another;
   forming a second mask over the first mask and over the mesa structure, wherein the second mask comprises an annular opening therein;
   patterning an annular opening in the first mask, and the covering layer, thereby exposing the oxidizable auxiliary layer that has been partially oxidized about a peripheral portion thereof;
   selectively removing the peripheral oxidized portion of the oxidizable auxiliary layer, thereby leaving a substantially non-oxidized, central portion of the auxiliary layer remaining;

etching into an exposed portion of the semiconductor intermediate layer to a predetermined depth, thereby defining a semiconductor relief portion of the semiconductor intermediate layer underlying the central portion of the auxiliary layer, wherein a height of the semiconductor relief is defined by the predetermined depth of the etch of the semiconductor intermediate layer; and removing the first and second masks, the covering layer, and the central portion of the auxiliary layer, thereby exposing the semiconductor relief.

16. The method of claim 15, wherein the semiconductor intermediate layer comprises a plurality of layers, and wherein one of the plurality of layers comprises an etch stop layer, wherein etching the exposed portion of the semiconductor intermediate layer continues down to the etch stop layer and substantially stops thereat, and wherein a location of the etch stop layer within the plurality of layers defines the predetermined depth.

17. The method of claim 15, further comprising forming one or more mirror layers over the semiconductor relief.

* * * * *